(12) United States Patent
Cheng et al.

(10) Patent No.: US 10,128,303 B2
(45) Date of Patent: *Nov. 13, 2018

(54) LIGHT ABSORPTION APPARATUS

(71) Applicant: Artilux Inc., Hsinchu County (TW)

(72) Inventors: Szu-Lin Cheng, Hsinchu County (TW);
Han-Din Liu, Sunnyvale, CA (US);
Shu-Lu Chen, Hsinchu County (TW)

(73) Assignee: Artilux Inc., Zhubei, Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/652,187

(22) Filed: Jul. 17, 2017

(65) Prior Publication Data

US 2017/0317135 A1 Nov. 2, 2017

Related U.S. Application Data

(63) Continuation of application No. 14/940,572, filed on Nov. 13, 2015, now Pat. No. 9,748,307.
(Continued)

(51) Int. Cl.
*H01L 27/146* (2006.01)
*H01L 31/0216* (2014.01)
(Continued)

(52) U.S. Cl.
CPC .... *H01L 27/14685* (2013.01); *H01L 27/1461* (2013.01); *H01L 27/1463* (2013.01); *H01L 27/1469* (2013.01); *H01L 27/14612* (2013.01); *H01L 31/028* (2013.01); *H01L 31/02161* (2013.01); *H01L 31/022408* (2013.01); *H01L 31/036* (2013.01); *H01L 31/105* (2013.01); *H01L 31/18* (2013.01); *H01L 31/1808* (2013.01); *H01L 31/1868* (2013.01); *Y02E 10/50* (2013.01); *Y02P 70/521* (2015.11)

(58) Field of Classification Search
None
See application file for complete search history.

(56) References Cited

U.S. PATENT DOCUMENTS

| 5,432,361 A | 7/1995 | Taguchi |
| 9,748,307 B2 | 8/2017 | Cheng et al. |

(Continued)

FOREIGN PATENT DOCUMENTS

| EP | 1811578 A1 | 7/2007 |
| JP | S61187267 A | 8/1986 |

(Continued)

OTHER PUBLICATIONS

International Search Report & Written Opinion PCT/US2015/60735 dated Apr. 14, 2016, pp. 1-13.
(Continued)

*Primary Examiner* — Khaja Ahmad
(74) *Attorney, Agent, or Firm* — Perkins Coie LLP

(57) ABSTRACT

A light absorption apparatus includes a substrate, a light absorption layer above the substrate on a first selected area, a silicon layer above the light absorption layer, a spacer surrounding at least part of the sidewall of the light absorption layer, an isolation layer surrounding at least part of the spacer, wherein the light absorption apparatus can achieve high bandwidth and low dark current.

18 Claims, 30 Drawing Sheets

Related U.S. Application Data

(60) Provisional application No. 62/078,986, filed on Nov. 13, 2014, provisional application No. 62/081,574, filed on Nov. 19, 2014, provisional application No. 62/121,448, filed on Feb. 26, 2015, provisional application No. 62/126,698, filed on Mar. 1, 2015, provisional application No. 62/197,098, filed on Jul. 26, 2015.

(51) Int. Cl.
*H01L 31/0224* (2006.01)
*H01L 31/028* (2006.01)
*H01L 31/036* (2006.01)
*H01L 31/105* (2006.01)
*H01L 31/18* (2006.01)

(56) References Cited

U.S. PATENT DOCUMENTS

| | | |
|---|---|---|
| 9,799,689 B2 | 10/2017 | Cheng et al. |
| 2004/0121507 A1 | 6/2004 | Bude et al. |
| 2005/0012030 A1 | 1/2005 | Mahajan et al. |
| 2006/0057825 A1 | 3/2006 | Bude et al. |
| 2006/0226343 A1 | 10/2006 | Ko |
| 2007/0170537 A1 | 7/2007 | Poenar et al. |
| 2007/0262296 A1 | 11/2007 | Bauer |
| 2008/0017883 A1* | 1/2008 | Sarid ............... H01L 31/1075 257/186 |
| 2008/0121805 A1 | 5/2008 | Tweet et al. |
| 2008/0303058 A1 | 12/2008 | Mori et al. |
| 2009/0121305 A1 | 5/2009 | Pan et al. |
| 2010/0313948 A1 | 12/2010 | Myong |
| 2011/0031529 A1 | 2/2011 | Miura et al. |
| 2013/0029449 A1 | 1/2013 | Cheng et al. |
| 2013/0119234 A1 | 5/2013 | Lee et al. |
| 2014/0048772 A1 | 2/2014 | Kim et al. |
| 2014/0077210 A1 | 3/2014 | Hekmatshoartabari et al. |
| 2014/0138789 A1 | 5/2014 | Lim et al. |
| 2014/0159183 A1 | 6/2014 | Na et al. |
| 2015/0145082 A1 | 5/2015 | Lee et al. |
| 2017/0179233 A1* | 6/2017 | Choi ............... H01L 29/157 |
| 2017/0323911 A1 | 11/2017 | Cheng et al. |

FOREIGN PATENT DOCUMENTS

| | | |
|---|---|---|
| JP | H06132558 A | 5/1994 |
| JP | H09307133 A | 11/1997 |
| JP | 2001284630 A | 10/2001 |
| JP | 2003163361 A | 6/2003 |
| JP | 3872473 B2 | 1/2007 |
| JP | 2010034226 A | 2/2010 |
| JP | 2010536170 A | 11/2010 |
| JP | 4938221 B2 | 5/2012 |
| JP | 2013062360 A | 4/2013 |
| JP | 2015144163 A | 8/2015 |
| TW | 200627635 A | 8/2006 |
| TW | 200633197 A | 9/2006 |
| TW | 201108402 A | 3/2011 |
| TW | 201115772 A | 5/2011 |
| TW | 201424013 A | 6/2014 |
| WO | 2003065418 A2 | 8/2003 |

OTHER PUBLICATIONS

Non Final Office Action dated Jan. 26, 2017, for U.S. Appl. No. 14/940,572 of Cheng, S. et al., filed Nov. 13, 2015.
Non Final Office Action dated Mar. 15, 2017, for U.S. Appl. No. 15/147,847 of Cheng, S. et al., filed May 5, 2016.
Notice of Allowance dated Apr. 10, 2017, for U.S. Appl. No. 14/940,572, filed Nov. 13, 2015.
Notice of Allowance dated Jun. 12, 2017, for U.S. Appl. No. 15/147,847, filed May 5, 2016.
Virginia Semiconductors, "The General Properties of Si, Ge, SiGe, SiO2 and Si3N4," Jun. 2002, URL:http://www.virginiasemi.com/pdf/generalpropertiesSi62002.pdf.
Tous, et al., "Nickel silicide contacts formed by excimer laser annealing for high efficiency solar cells", Progress in Photovoltaics, https://www.researchgate.net/profile/Loic_Tous/publication/236149298_Nickel_silicide_contacts_formed_by_excimer_laser_annealing_for_high_efficiency_solar_cells/links/00b495280b8f0d9496000000.pdf, 2013, pp. 1-10.
Yumrukcu, Samed, "Passivation of INSB Infrared Photodetectors", Bilkent University, http://www.thesis.bilkent.edu.tr/0004030.pdf, Jul. 2010, pp. 1-54.
Notice of Allowance dated Feb. 2, 2018 for Japanese Patent Application No. 2017-530346 filed May 15, 2017, 3 pages.
Notice of Reasons for Rejection dated Feb. 14, 2018 for Korean Patent Application No. 10-2017-7015424, 11 pages.
Extended European Search Report; EP Application No. 15858667.7; dated Jun. 8, 2018.
Korean Office Action, KR Application No. 10-2017-7015424; dated Jun. 21, 2018.
Notice of Allowance dated Jun. 21, 2018 for U.S. Appl. No. 15/654,197, filed Jun. 19, 2017.
Notice of Decision for Rejection dated Aug. 9, 2018 for Korean Patent Application No. 10-2017-7015424, 6 pages.
U.S. Appl. No. 16/023,493 of Chen, S-L. et al., filed Jun. 29, 2018.

* cited by examiner

LIGHT ABSORPTION APPARATUS

PRIORITY ENTITLEMENT

This application is a continuation application of U.S. patent application Ser. No. 14/940,572, entitled "LIGHT ABSORPTION APPARATUS," filed Nov. 13, 2015, which claims the benefit of U.S. Provisional Patent Application No. 62/078,986, filed Nov. 13, 2014; and U.S. Provisional Patent Application No. 62/081,574, filed Nov. 19, 2014; and U.S. Provisional Patent Application No. 62/121,448, filed Feb. 26, 2015; and U.S. Provisional Patent Application No. 62/126,698, filed Mar. 1, 2015; and U.S. Provisional Patent Application No. 62/197,098, filed Jul. 26, 2015; all of which are incorporated by reference herein in their entireties.

FIELD OF THE INVENTION

The present disclosure relates to a light absorption apparatus, especially to a semiconductor based photodiode.

DESCRIPTION OF PRIOR ART

A semiconductor based photodiode typically includes an intrinsic semiconductor region between a P-type semiconductor and an N-type semiconductor doping regions. The presence of an intrinsic region is in contrast to an ordinary PN diode, and the photons can be absorbed in the intrinsic region and the generated photo-carriers can be collected from the P-type and N-type regions.

SUMMARY OF THE INVENTION

It is an object of the present disclosure to provide a semiconductor based photodiode with lower dark current and high absorption. More specifically, the photodiode includes germanium as the photo-absorption material based on a silicon substrate.

According to one aspect of the present disclosure, a method for forming a light absorption apparatus, includes: (1) forming an isolation layer above a substrate, (2) removing part of the isolation layer to expose a selected area, (3) forming a spacer covering at least part of the sidewall of the selected area, (4) epitaxially growing a first absorption layer including germanium within the selected area, (5) forming a passivation layer including Silicon above the first absorption layer, wherein the surface leakage current can be reduced by passivating the first absorption layer, and a low leakage and high sensitivity light absorption apparatus can be formed.

According to another aspect of the present disclosure, a method for forming a light absorption apparatus, includes: (1) forming a first doping region at least partially embedded in a substrate, (2) forming a first layer above the first doping region, (3) forming a second layer including germanium above the first layer, (4) forming a third layer covering the second layer, (5) forming a fourth layer including oxide above the third layer, (6) forming a fifth layer including nitride above the fourth layer, (7) removing the fifth layer and stopping on the fourth layer, (8) forming a sixth layer above the fourth layer, wherein the second layer has lattice mismatch to the surface of the substrate, and the sixth layer has a predetermined thickness such that a predetermined reflectivity can be achieved when an optical signal passing and being reflected by the sixth layer, at least part of the optical signal is absorbed by the second layer.

According to still another aspect of the present disclosure, a light absorption apparatus includes: a substrate, a light absorption layer above the substrate on a first selected area, a passivation layer including Silicon above the light absorption layer, a spacer surrounding at least part of the sidewall of the light absorption layer, an isolation layer surrounding at least part of the spacer, wherein the light absorption apparatus can achieve high bandwidth and low leakage current.

According to still another aspect of the present disclosure, a light absorption apparatus includes: a substrate, a light absorption layer formed above the substrate and includes an upper part within a first opening and a lower part within a second opening at least partially overlapping with the first opening, a passivation layer including silicon above the upper part of the light absorption layer, a spacer surrounding at least part of the sidewall of the upper part of the light absorption layer, an isolation layer surrounding at least part of the spacer and the lower part of the light absorption layer, wherein light absorption apparatus can achieve high bandwidth and low leakage current.

BRIEF DESCRIPTION OF DRAWINGS

One or more embodiments of the present disclosure are illustrated by way of example and not limitation in the figures of the accompanying drawings, in which like references indicate similar elements. These drawings are not necessarily drawn to scale.

DETAILED DESCRIPTION

Figure 1:
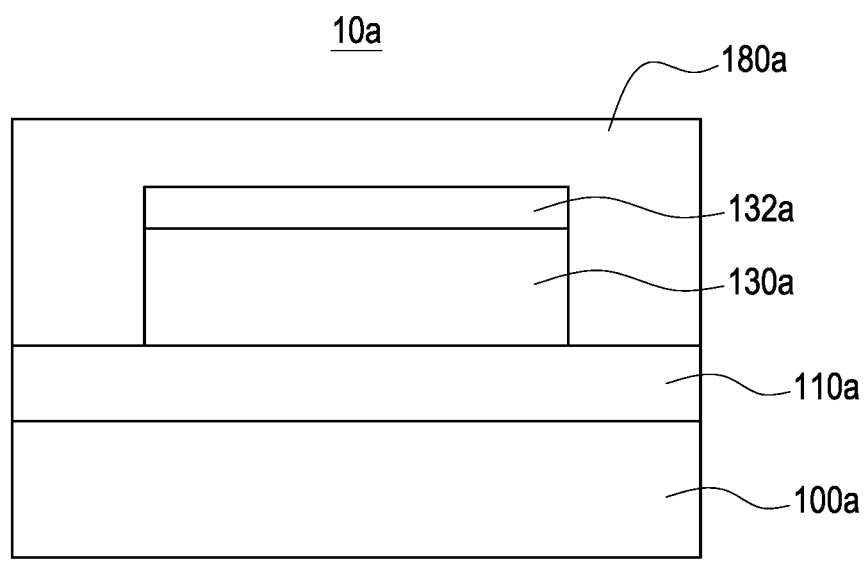
FIG. 1 shows a PIN photodiode structure.

FIG. 1 shows a photodiode 10a, which comprises a silicon (Si) substrate 100a, an n-type doped region 110a within the Si substrate 100a located near the upper surface of the Si substrate 100a, an intrinsic germanium (Ge) region 130a arranged on the upper surface of the Si substrate 100a, a p-type Ge region 132a arranged on the upper surface of the intrinsic Ge region 130a and an oxide passivation 180a surrounding the intrinsic Ge region 130a and the p-type Ge region 132a as well as covering the upper surface of the Si substrate 100a.

For the structure shown as FIG. 1, a heterogeneous interface is present between the Ge region 130a and the underlying Si substrate 100a. Heterogeneous interface can be implemented by using heteroepitaxy, a type of epitaxy performed by growing a crystalline material of different elemental configurations than the crystalline substrate that is grown on. Examples include but are not limited to, GaN on sapphire, GaN on Si, Ge on Si. The crystalline materials can be elemental or compound semiconductors.

For some applications, electrically intrinsic material property is needed on either grown film or substrate or both for better device performance. Intrinsic semiconductor is a semiconductor exhibiting electrically neutral property. Here a region with carrier concentration below $10 \times 10^{17}$ cm$^{-3}$ is considered intrinsic. However, intrinsic material is sometimes difficult to obtain at the heterogeneous interface. Electrically polarized layers often unintentionally formed near the interface due to lattice-mismatched defect formation, inter-diffusion (or cross diffusion) between two materials (Components of one material can sometimes become the other material's active dopants), contamination during film growth, or energy band alignment induced Fermi level pinning. For example, a p-type Ge layer is generally formed at the interface of Ge-on-Si system.

Furthermore, if such dislocations and other types of defects formed at the heterogeneous interfaces due to lattice mismatch, are located within the semiconductor depletion region, it could increase the photodiode's dark current, namely leakage current under dark condition, due to trap-assisted carrier generation and therefore degrade the performance as well as narrows the design window. It is observed that the trap-assisted generation mechanism can be effectively reduced by passivating this defective region with high doping concentration such that the defect trap states are filled with extrinsic dopant assisted carriers to neutralize the carrier generation rate. To achieve this doping passivation technique, precise dopant control in highly-defective area is sometimes difficult due to the nature of defect assisted dopant diffusion. Uncontrolled dopant diffusion may cause unwanted performance and reliability penalties, such as device responsivity degradation and yield reduction.

In some of the implementations of fabricating a Ge on Si photodiode as shown in FIG. 1, Ge mesa patterning is required to define the optical absorption area (namely the intrinsic Ge region 130a in FIG. 1) if a blanket type epitaxial growth is used. Blanket type epitaxial growth is an epitaxial growth performed on the entire substrate wafer surface. Reactive ion etching (RIE) and inductively coupled plasma (ICP) etching are common methods for patterning Ge mesas after the blanket epitaxial growth where desired mesa sidewall angles are achieved with carefully engineered anisotropic etch recipes. However, anisotropic etch normally involves ion bombardment on patterned structures and often leads to Ge sidewall surface damage. Damaged sidewall surfaces result in defects and dangling bonds that increases the photodiode dark current. To avoid such device degradation, a conformal damage-free selective Ge etch approach (selective over Si) is presented to remove the anisotropic etch induced damaged surface layers. For example, a selective etch can be defined as etch rate differences between Ge and Si larger than a 5 to 1 ratio.

For a higher operation speed photodiode or photodetector, the thickness of the photo-sensitive layer, namely the intrinsic Ge region 130a shown in FIG. 1, needs to be thin enough to minimize carrier transit time but at the expense of lower photo-responsivity. To improve responsivity and still maintain high speed, an optical reflector can be placed atop the photo-sensitive layer. The reflector materials can include one dielectric layer (ex: oxide or nitride), multiple dielectric layers, metal (ex: Aluminum), or any combinations of materials listed above. Forming such reflectors requires strict thickness tolerance (<5%) to ensure the targeted reflectivity is within a desired spectrum, which can be relatively difficult for conventional foundries. An etch or polish stopping layer is presented in this disclosure to improve the thickness uniformity control for the desired reflector structure. Hereinafter, the light absorption apparatus will be exemplified as a PIN photodiode. However, this particular example is not a limitation for the scope of the present disclosure. For example, a NIP structure can also be implemented by certain implementations of this disclosure. Furthermore, other light absorption material such as SiGe with various Ge contents can be used.

Figure 2A:
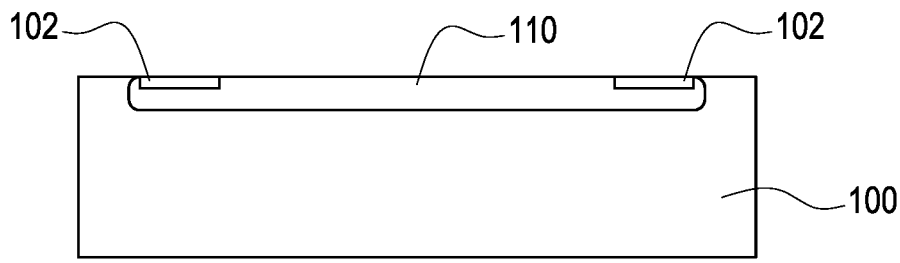
FIGS. 2A to 2H show implementations to form a photodiode structure.

FIGS. 2A to 2F are the sectional views illustrating the manufacturing steps of the light absorption apparatus according to the first embodiment of the present disclosure, where a counter doping layer is presented to reduce the operation bias or/and reduce the leakage current at the heterogeneous interface. As shown in FIG. 2A (step S100), a semiconductor substrate 100 is provided and n+ doped layer 110 is formed near the upper face of the substrate 100. The n+ doped layer 110 may be formed methods such as, but not limited to, ion implantation, gas phase diffusion and epitaxial layer growth with simultaneous in-situ doping combined with optional thermal treatment procedures for dopant diffusion and activation. Two high doping regions 102 for reduced resistance contacts are formed with higher doping levels than that of the n+ doped layer 110. For example, the doping concentration is larger than $1 \times 10^{19}$ cm$^{-3}$ for the n+ doped layer 110, and is larger than $1 \times 10^{20}$ cm$^{-3}$ for the contacts 102.

In some embodiments of the present disclosure and as shown in FIG. 2A, the semiconductor substrate 100 is a bulk semiconductor substrate. When a bulk semiconductor substrate is employed, the bulk semiconductor substrate can be comprised of any semiconductor material including, but not limited to, Si, Ge, SiGe, SiC, SiGeC, InAs, GaAs, InP or other like III/V compound semiconductors. Multilayers of these semiconductor materials can also be used as part of the bulk semiconductor substrate. In one embodiment, the semiconductor substrate 100 comprises a single crystalline semiconductor material, such as, for example, single crystalline silicon. In another embodiment, a semiconductor-on-insulator (SOI) substrate (not specifically shown) is employed as the semiconductor substrate 100. When employed, the SOI substrate includes a handle substrate, a buried insulating layer located on an upper surface of the handle substrate, and a semiconductor layer located on an upper surface of the buried insulating layer. The handle substrate and the semiconductor layer of the SOI substrate may comprise the same, or different, semiconductor material. The term "semiconductor" as used herein in connection with the semiconductor material of the handle substrate and the semiconductor layer denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate and the semiconductor layer. In one embodiment, the handle substrate and the semiconductor layer are both comprised of silicon. In another embodiment, hybrid SOI substrates are employed which have different surface regions of different crystallographic orientations. In this example, the semiconductor substrate 100 is exemplified as silicon substrate 100.

Figure 2B:
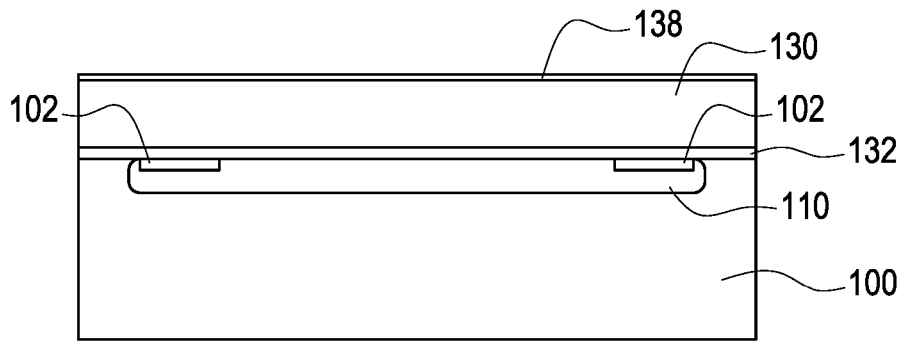

As shown in FIG. 2B (step S102), an epitaxially-deposited light absorption epitaxial layer (such as a Ge epitaxial layer) 130 is formed atop the doped layer 110 and further includes a counter doping layer 132 between the doped layer 110 and the Ge epitaxial layer 130. In some implementations, the thickness of the counter doping layer 132 can range from 1 nm to 150 nm, dependent on the doping profile near the interface. The dopants inside the counter doping layer 132 should be able to provide similar free carrier concentration to compensate for the built-in potentials/carriers at the interface by providing opposite charge polarity for electrical neutralization and to reduce the built-in potential and hence the operation bias and/or leakage current. For Ge-on-Si system, the interface is naturally p-type and therefore, dopants inside counter doping layer 132 preferably are n-type dopants, for example, As, P or their combinations. The counter doping layer 132 can be formed by in-situ doping during epitaxially growing the Ge epitaxial layer. In an in-situ doping process, the dopant is introduced during the deposition of the crystalline semiconductor material. Alternatively, the counter doping layer 132 can be formed other approaches such as, but not limited to, ion implantation with n-type dopants. The counter doping layer may be of same material as layer 130 or a different material such as SiGe with various Ge contents. In some implementations, additional layers may be added in-between layer 132 and layer 130 to reduce layer 132 dopings from diffusion towards layer 130. For example, this optional layer may be of SiGe material with various Ge contents. After the Ge epitaxial layer 130 and the counter doping layer 132 are formed, an oxide cap 138 is formed atop the Ge epitaxial layer 130 to protect the Ge surface.

Figure 2C:
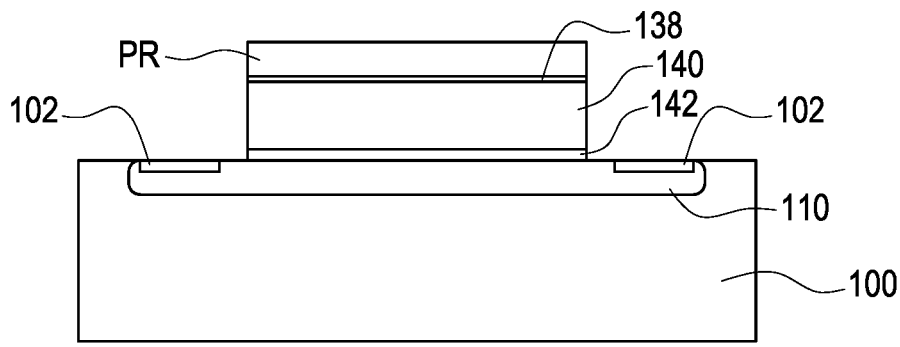

As shown in FIG. 2C (step S104), after the oxide cap 138 is formed, lithography and etching processes are performed to define a Ge mesa region 140 and the counter doping mesa region 142, to expose the upper surface portion of the silicon substrate 100.

Figure 2D:
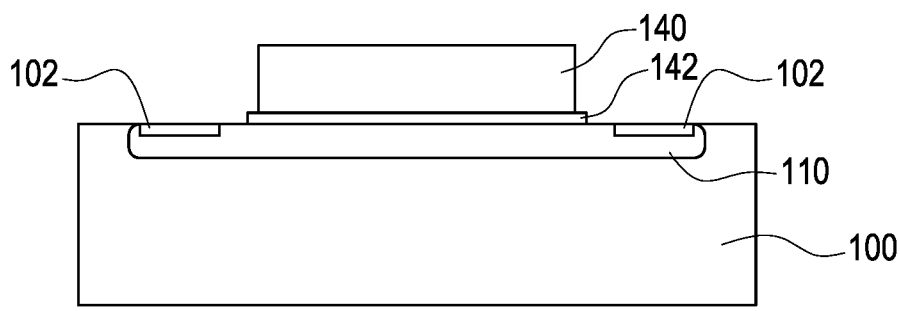

As shown in FIG. 2D (step S106), suitable etchant is used to laterally recess the Ge epitaxial mesa region 140 or/and the counter doping mesa region 142.

Figure 2E:
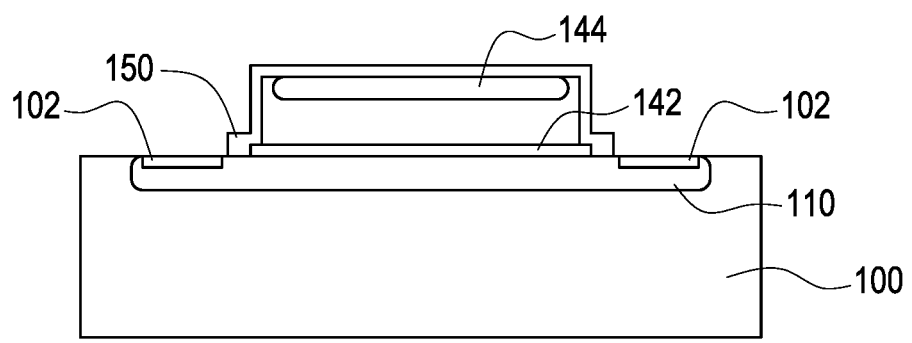

As shown in FIG. 2E (step S108), a passivation layer 150 is formed atop the resulting structure to passivate the Ge surface and p-type doped region 144 is formed near the upper surface of the Ge mesa region 140 by semiconductor manufacturing processes such as ion implantation. In some implementations, the passivation layer 150 can be amorphous silicon (a-Si) or poly-crystalline silicon (poly-Si). In other implementations, during the doping process of region 144, passivation layer 150 can be doped simultaneously and used for contacts formation including salicide. In some implementations, the area of the doped region 144 can have different shape from the mesa region 140 when viewing from the top. For example, the shape of the mesa region 140 can be rectangular and the shape of the doped region 144 can be circular. In some implementations, the area of the doped region 144 can have similar shape as the mesa region 140 when viewing from the top. For example, the shape of the mesa region 140 and the doped region 144 can both be rectangular or circular.

Figure 2F:
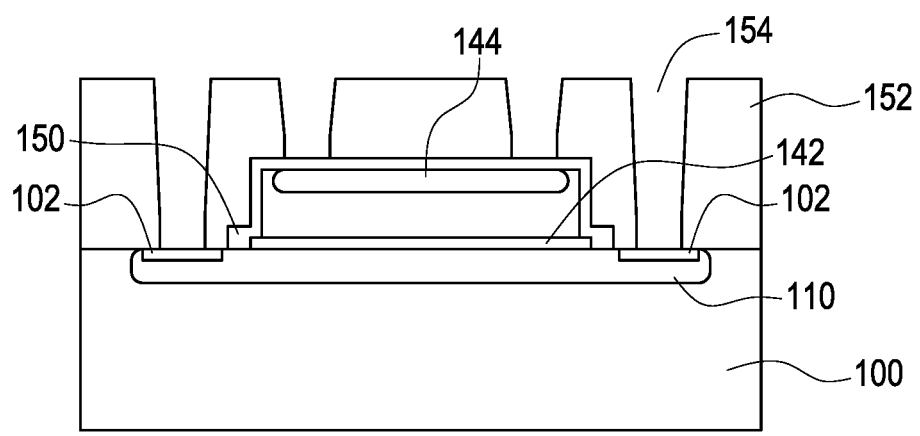

As shown in FIG. 2F (step S110), inter-layer dielectric (ILD) layer 152 is formed atop the resulting structure with a topography due to the Ge mesa, and a CMP (Chemical Mechanical Polishing) process is performed to reduce the surface topography. Inter-layer dielectric (ILD) may be deposited several times to attain the desired thickness. Afterwards, contact opens 154 are defined through lithography and etching processes to expose the highly doped silicon surface 102 and some part of passivation layer 150.

Figure 2G:
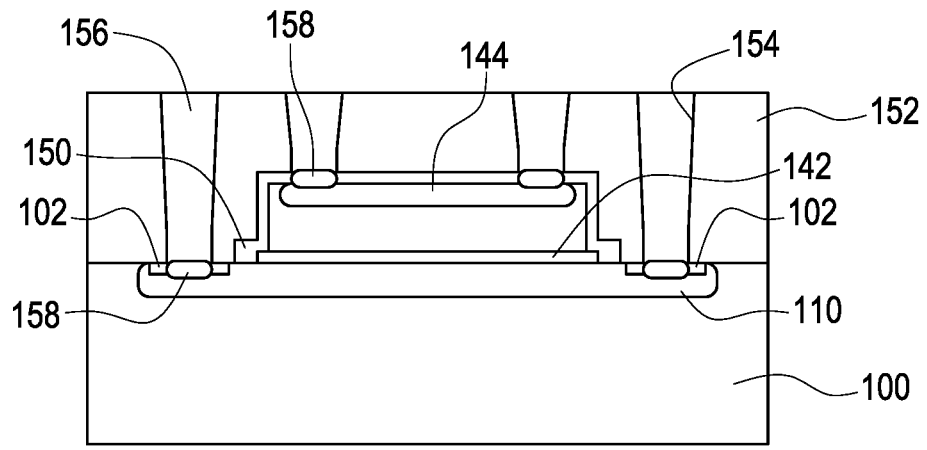

As shown in FIG. 2G (step S112), salicide 158 is formed atop the silicon substrate 102 surface by introducing metals such as Ni, Co, Ti, Pt followed by thermal forming processing and then removing the un-reacted parts. Then tungsten plugs (W plugs) 156 is formed within the contact opens 154 atop the silicide 158.

Figure 2H:
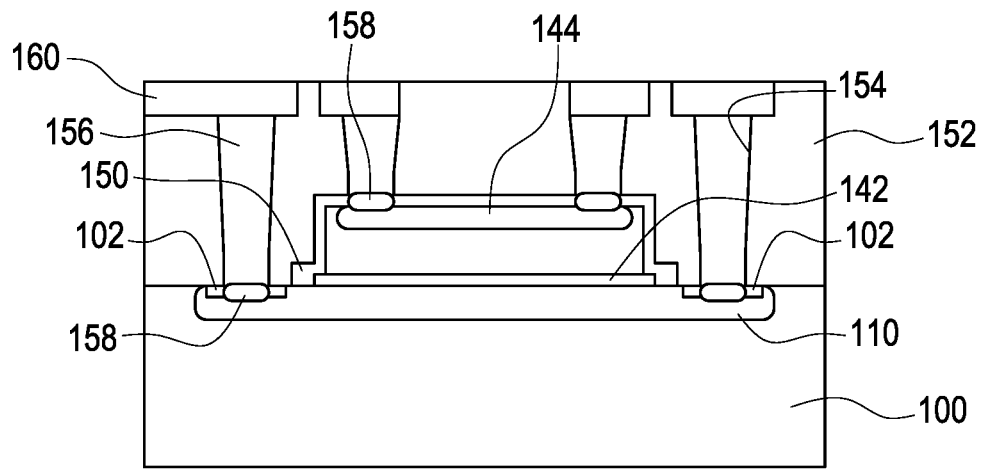

As shown in FIG. 2H (step S114), a metal interconnect (M1 layer) 160 is formed to provide electrical connection to external circuits. In some implementations, if the optical signal is incident from the top of FIG. 2H, an ARC coating can be added on top of the photodiode by first etching an opening from ILD 152 on top of the Ge mesa region 140. In some implementations, if the optical signal is incident from the bottom of FIG. 2H, an ARC coating can be added on the bottom top of the photodiode by first thinning the substrate.

In this implementation, the counter doping mesa region 142 below the Ge mesa region 140 with n-type dopants and suitable thickness (1 nm to 150 nm) is formed to compensate the p-type heterogeneous interface reduce the built-in potential and hence the operation bias and/or leakage current. Note that in FIGS. 2A-2H, two contact points shown for both the substrate contact and the upper absorption region contacts are for illustrative purpose in the 2D cross-section views. In some implementations, single continuous contact via or ring to the substrate and the absorption region can also be formed to extract photo-generated carriers from the light absorption region. Also note that in FIGS. 2E-2H, the passivation layer 150 shown covering the light absorption region is for illustrative purpose, and this passivation layer 150 can also extend into other regions as long as it does not prohibit the tungsten plugs (W plugs) 156 or other forms of contact vias to making electrical connection to the doped region 102 and 144. Furthermore, the segmented doped layer 110 in FIGS. 2E-2H are for illustrative purposes and in some implementations, it may extend into other regions. The P doped layer 144 in FIGS. 2A-2H are for illustrative purposes and in some implementations, it may extend to the sidewalls of layer 140 in other embodiments.

Figure 3A:
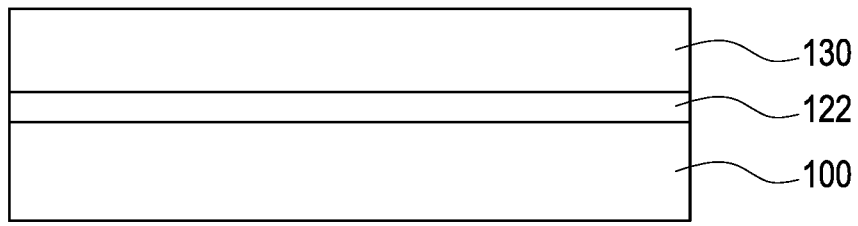
FIGS. 3A to 3C show implementations to form a counter doping layer in a photodiode structure.
Figure 3B:
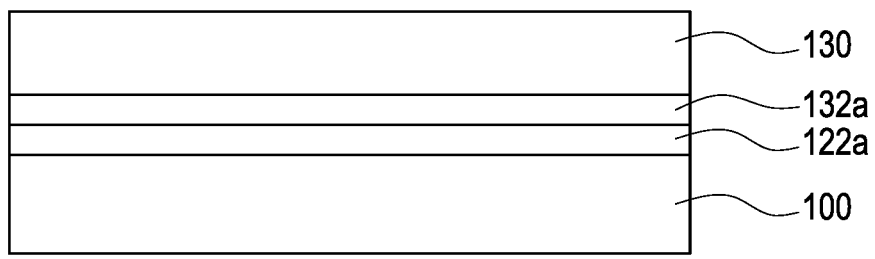
Figure 3C:
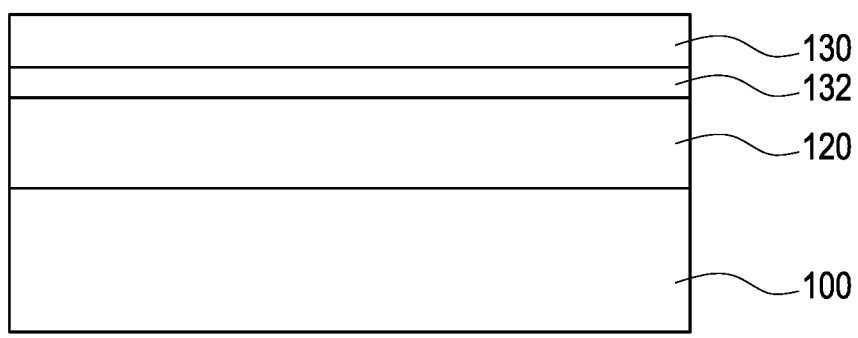

FIGS. 3A to 3C show other implementations to form an intrinsic region near the heterogeneous interface. As shown in FIG. 3A, the step S102 corresponding to FIG. 2B can be further described by step S102a with following sub-steps: a counter doping layer 122 is formed on upper surface of the Si substrate 100, where the counter doping layer 122 can be formed by ion implantation. Afterward, a layer 130 is formed. As shown in FIG. 3B, the step S102 corresponding to FIG. 2B can be replaced by a step S102b with following sub-steps: a first counter doping layer 122a is formed on upper surface of the Si substrate 100, where the first counter doping layer 122a can be formed by ion implantation. Afterward an epitaxially-grown Ge layer 130 is formed atop the substrate 100 and the Ge epitaxial layer 130 has a second counter doping layer 132a. The heterogeneous interface is present between the first counter doping layer 122a (Si-based material) and the second counter doping layer 132a (Ge-based material). In some implementations, the thickness of the first counter doping layer 122a ranges from 1 nm to 150 nm, depending on the doping profile near the interface. Moreover, the dopants inside the first counter doping layer 122a should be able to provide similar free carrier concentration as those built-in potential/carriers in Ge epitaxial layer 130 but with opposite charge polarity for electrical neutralization. In some implementations, the thickness of the second counter doping layer 132a ranges from 1 nm to 150 nm. Moreover, the dopants inside the second counter doping layer 132a should be able to provide similar free carrier concentration as those built-in potential/carriers in Si/Ge interface but with opposite charge polarity for electrical neutralization due to P-type interface between Si and Ge caused by p-type interfacial defects and heterojunction hole confinement.

As shown in FIG. 3C, the step S102 corresponding to FIG. 2B can be replaced by a step S102c with following sub-steps: A Si epitaxial layer 120 is formed on the Si substrate 100. The Si substrate 100 can be doped at the interface near the epitaxial layer 120. An epitaxially-grown Ge layer 130 is formed atop the Si epitaxial layer 120 and the Ge layer 130 further includes a counter doping layer 132. The thickness of the counter doping layer 132 ranges from 1 nm to 150 nm is preferably doped by n-type dopants, for example, As, P or their combinations to compensate the p-type interface. The counter doping layer 132 can be formed by in-situ doping during epitaxially growing the Ge layer or by ion implantation with n-type impurities. In some implementations, the Si epitaxial layer 120 can provide multiple purposes including reducing the dopant diffusions from the doped substrate, or/and to reduce the junction capacitance due to its smaller dielectric index than Ge.

In the examples shown in FIGS. 2B to 2H, the counter doping layer or the counter doping mesa can be broadly referred to as an interfacial layer between a silicon layer and another epitaxial layer including germanium. The major composition of the counter doping layer can be either silicon or germanium or their alloy. In the example shown in FIG. 3A, the counter doping layer 122 can be broadly referred to as an interfacial layer between the silicon substrate 100 and the Ge epitaxial layer 130. In the example shown in FIG. 3B, the first counter doping layer 122a and the second counter doping layer 132a can be broadly referred to as an interfacial layer between the silicon substrate 100 and the Ge epitaxial layer 130 even though two layers are involved in this example. In the example shown in FIG. 3C, the counter doping layer 132 can be broadly referred to as an interfacial layer between the silicon substrate 100 and the Ge epitaxial layer 130 even though the Si epitaxial layer 120 is sandwiched between the silicon substrate 100 and the counter doping layer 132. In the present disclosure, the interfacial counter doping layer can be a single layer or multiple layers between a layer A and a layer B and provides an intrinsic region between the layer A and the layer B. Moreover, the interfacial layer is not necessary to be in direct contact with one of the layer A and the layer B, other layer can be interposed between the interfacial layer and the layer A, or between the interfacial layer and the layer B as long as a substantially intrinsic region can be present between the layer A and the layer B.

Figure 4A:
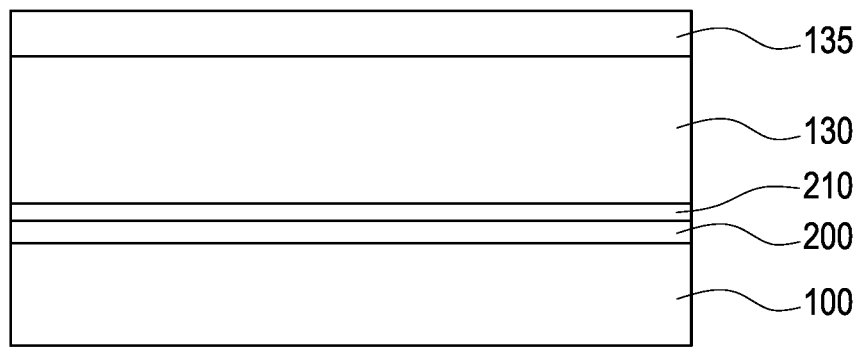
FIGS. 4A to 4C show implementations to form a diffusion control layer or/and counter doping layer in a photodiode structure.
Figure 4B:
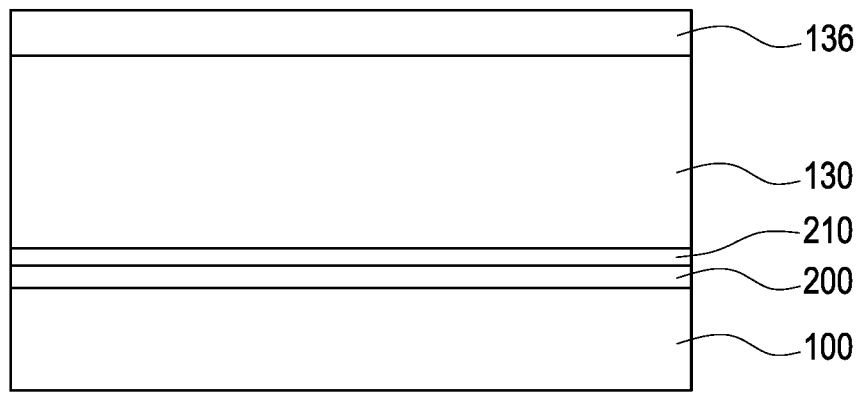
Figure 4C:
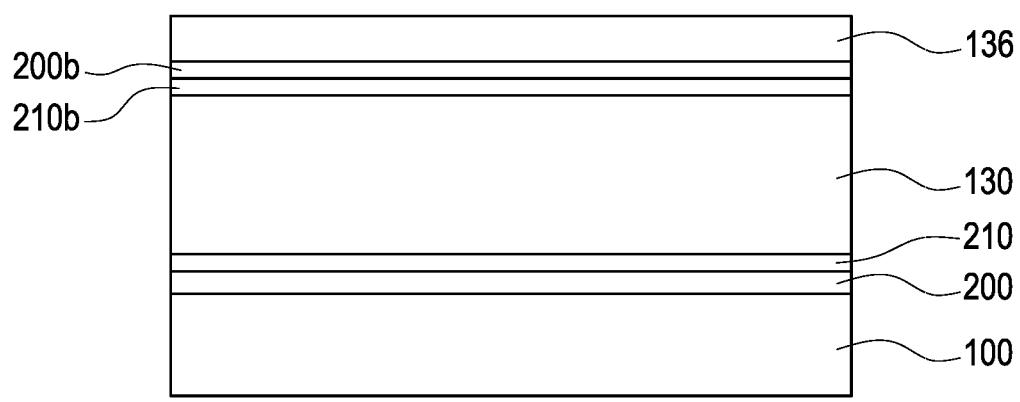

FIGS. 4A to 4C are the sectional views illustrating the manufacturing steps of forming a photodiode with reduced defect assisted dopant diffusion according to an implementation of the present disclosure. As shown in FIG. 4A, a doping layer 200 is formed atop the substrate material 100 by either epitaxial growth or ion implantation. Then a dopant control layer 210 is formed above the doping layer 200. In some implementations, the dopant control layer 210 includes silicon germanium, the doping layer 200 includes germanium or silicon germanium and the dopant inside the doping layer 200 includes phosphorous (P). An epitaxial layer 130 including Ge is formed atop the dopant control layer 210 as the photo-sensitive region, and a top doped layer 135 is formed atop the epitaxial layer 130. In some implementations, the dopants in the top doped layer 135 include boron (B).

In some implementations, the doping layer 200 can be formed by driving dopants from substrate material 100 into initially undoped 200 layer region. The driving process can be done after dopant control layer 210 and at least part of epitaxial layer 130 is formed. The material of the epitaxial layer 130 can be, but not limited to, Si, SiGe with Ge content from 1% to 100%. The material of the dopant control layer 210 can be, but not limited to SiGe with Ge content less than that from epitaxial layer 130, carbon-doped SiGe, or carbon-doped Ge. The material of the doping layer 200 can be, but not limited to, highly-doped Ge, highly-doped SiGe with Ge content no higher than epitaxial layer 130 and no less than dopant control layer 200.

The doped layer 200 has the same electrical polarity as that of the Si substrate 100 (for example n-type doping). If Si substrate 100 is in direct contact with the Ge epitaxial layer 130 with lattice mismatch, it will induce defects and lead to higher dark current and faster dopant diffusion. As a result, the dopant control layer 210 is designed to place near the Si/Ge interface as dopant block to allow dopants from substrate 100 to be driven into the doping layer 200 only for reducing dark current generation by passivating defect stats without going deeper into the epitaxial 130 region and leading to device degradation. In some implementations, the doped layer 200 can function as a counter doping layer as described before to reduce the operation bias and/or leakage current.

As shown in FIG. 4B, it is similar to FIG. 4A except the top doped layer 135 is replaced by a heterogeneous top doped layer 136 with different material composition than the photo-sensitive material below. The heterogeneous doped layer 136 is made out of Si or SiGe such that minor or zero lattice mismatch is introduced between the Ge epitaxial layer 130 and the heterogeneous top doped layer 136.

As shown in FIG. 4C, it is similar to FIG. 4B except that another set of doping layer 200b and dopant control layer 210b is introduced between the photo-sensitive material and the top doped layer 136 to improve the heterogeneous interface quality. The dopant control layer 210b is introduced to reduce the dopant diffusion from the top doped layer 136 into the photo-sensitive region 130. The top doped layer 136 can include Si, Ge or their combination. The dopants in the top doped layer 136 can include B, P, As and their combination. In some implementations, the doping layer 200b can have the same doping polarity as the top doped layer 136. In some implementations, the doping layer 200b can function as a counter doping layer as described before to reduce the interface built-in potential and reduce the operation bias.

In the examples shown in FIGS. 4A to 4B, the doped layer 200 and the dopant control layer 210 can be referred to as an interfacial layer between the Si substrate 100 and the epitaxial layer 130 even there are two layers between the Si substrate 100 and the epitaxial layer 130 in those examples. Similarly, in the example shown in FIG. 4C, the doping layer 200b and the top dopant control layer 210b can be referred to as an interfacial layer between the top doped layer 136 and the epitaxial layer 130. In the present disclosure, the interfacial layer can be a single layer or multiple layers between a layer A and a layer B and control dopants diffusion between the layer A and the layer B. Moreover, the interfacial layer is not necessary to be in direct contact with one of the layer A and the layer B, other layer can be interposed between the interfacial layer and the layer A, or between the interfacial layer and the layer B as long as dopant diffusion can be controlled within the interfacial layer between the layer A and the layer B. In some implementations, the relative position of the dopant control layer and the doping layer can be interchanged, namely the dopant control layer can be either above or below the doping layer. In some implementations, the doping layer can function as the counter doping layer as described before.

Figure 5A:
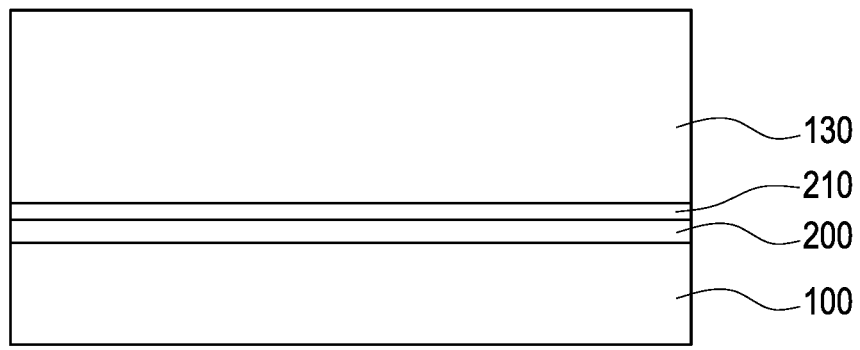
FIGS. 5A to 5B show implementation of the structure shown in FIG. 4A.
Figure 5B:
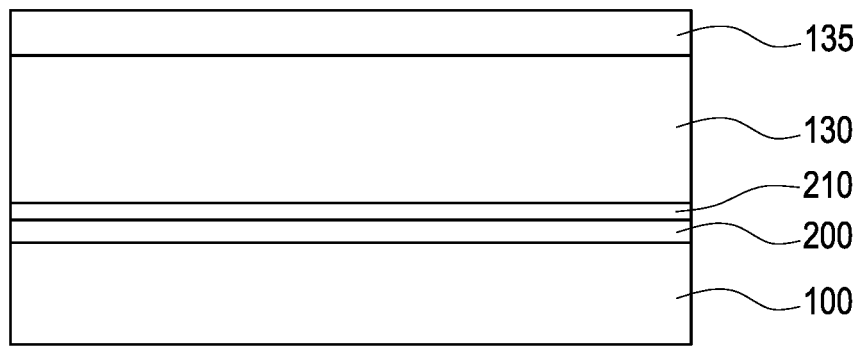

FIGS. 5A to 5B show one implementation of the structure shown in FIG. 4A. An epitaxial layer 130 including intrinsic-Ge is grown on a N-type phosphorus-doped Si substrate 100 by first growing a seeding layer 200 has similar material composition as the epitaxial layer 130, and then growing a dopant control layer 210 including Si or SiGe function to reduce phosphorus diffusion into the epitaxial Ge layer where it diffuses fast and can compromise the desired intrinsic property. The thickness and location of the seeding layer 200 and the dopant control layer 210 can be well controlled during the growth. In some implementations, the dopant control layer 210 ranges from 50 nm to 150 nm and including SiGe. As shown in FIG. 5B, a top doped layer 135, which has opposite electrical polarity to the top layer of the Si substrate 100, is formed to yield a p-i-n photodiode/photodetector structure.

Figure 6A:
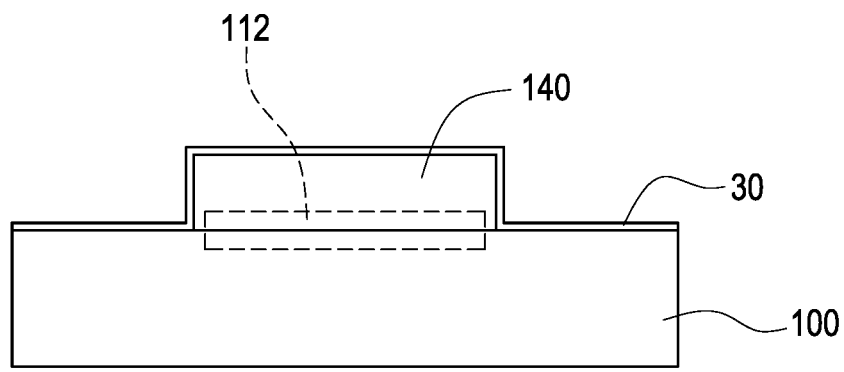
FIGS. 6A to 6E are the sectional views illustrating the manufacturing steps of forming a photodiode with etch/polish stopper according to another implementation of the present disclosure.

FIGS. 6A to 6E are the sectional views illustrating the manufacturing steps of forming a photodiode with etch/polish stopper according to another implementation of the present disclosure. As shown in FIG. 6A, the process can succeed the step S106 shown in FIG. 2D. The doped region 102 and 110 are omitted here for simple illustrative purpose. A first interfacial layer 112 is formed atop the Si substrate 100, and a second layer 140 including Ge is formed atop the first interfacial layer 112. The first interfacial layer 112 (shown as an dashed box) can be used for counter doping as described with reference to FIGS. 2A to 3C, or for diffusion control as described with reference to FIGS. 4A to 4C, or a material with larger dielectric index than that of the second layer 140 for bandwidth adjustment. Also shown in FIG. 6A, a passivation layer 30 with material such as, but not limited to, Si (amorphous or poly-crystalline), silicon oxide, nitride, high-k dielectric, or their combinations is formed to passivate and protect the second layer 140.

Figure 6B:
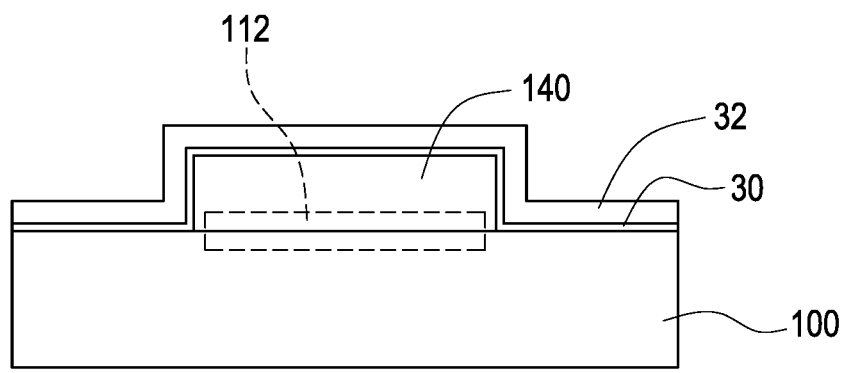
Figure 6C:
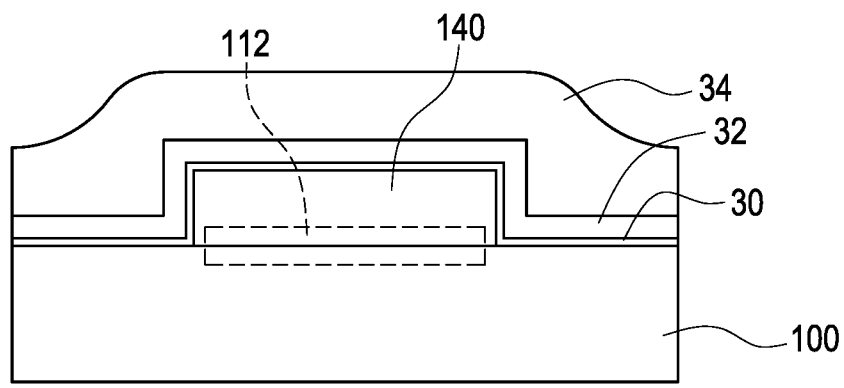
Figure 6D:
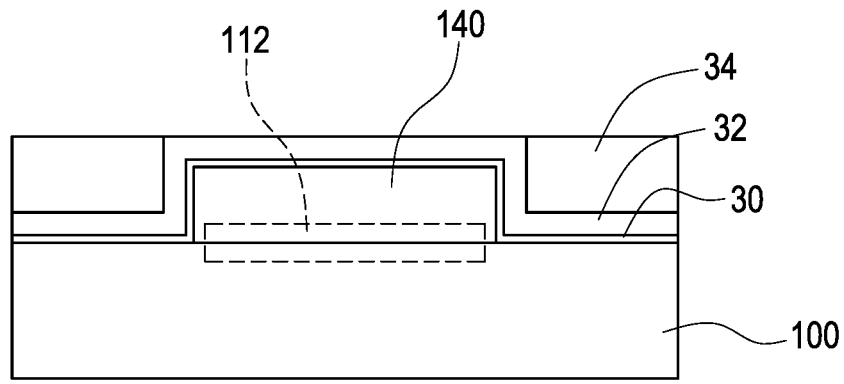
Figure 6E:
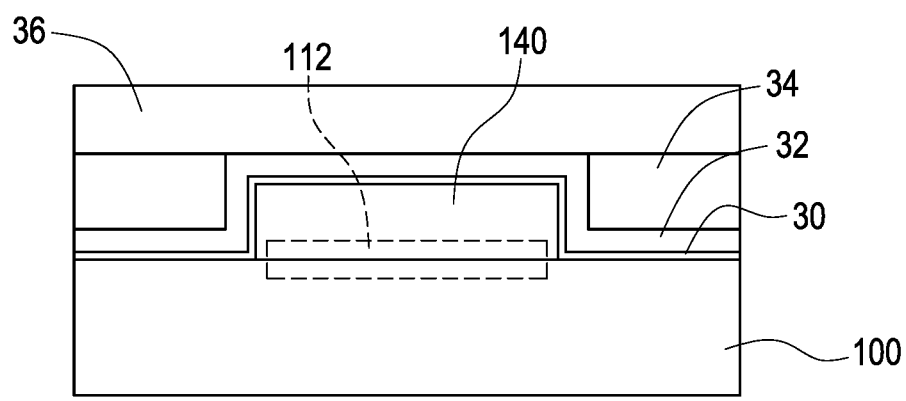

As shown in FIG. 6B, a stopping layer 32 with material such as, but not limited to, nitride is formed as a blanket layer atop the passivation layer 30. In some implementations, the stopping layer can also include multiple layers including oxide and nitride. In some implementations, the thickness of the stopping layer 32 ranges typically from, but not limited to 10 A to 2000 A, with a thickness from 100 A to 500 A being more typical. Afterward, an interlayer dielectric (ILD) layer 34 is then deposited to cover the whole mesa structure and can be optionally first pre-planarized by either reflow or chemical mechanical polish (CMP) process as shown in FIG. 6C. The ILD layer 34 uses material such as, but not limited to, silicon oxide which has different material composition than the stopping layer 32. As shown in FIG. 6D, the ILD layer 34 is processed by CMP process until the portion of the ILD layer 34 atop the stopping layer 32 is substantially removed. If a pre-planarized process in FIG. 6C is not performed, then a single planarizing process such as CMP can be used to form the structure in FIG. 6D. More particularly, the removal process is designed to fully terminate on top of the mesa stopping layer 32 with minimum thickness loss. Namely, the removal process for the ILD layer 34 needs to be highly selective to the stopping layer 32. For example, the selectivity could be larger than 1:5. Afterward, as shown in FIG. 6E a reflector 36 is then uniformly deposited on top of the stopping layer 32. With this approach, the thickness uniformity of the top reflector 36 can be well controlled by film deposition step instead of a polish process, meaning better uniformity control than conventional planarization process. The reflector 36 is used for either reflection or tuning optical cavity path length or combinations of both. In some implementations, a reflector including a metal layer on top of a dielectric layer can achieve >95% reflectivity, wherein an optical signal incident from the bottom of FIG. 6E can be reflected for further absorption of the second layer 140. In some implementations, a reflector including oxide or nitride can be formed to achieve less than 50% reflectivity and an optical signal can incident from the top of FIG. 6E. In some implementations, an anti-reflection-coating (ARC) layer can be added between the external optical source and the second layer 140. The reflector can include one dielectric layer (ex: oxide or nitride), multiple dielectric layers, metal (ex: Aluminum), or any combinations of materials listed above. In some implementations, the reflector 36 can include dielectric such as oxide, or a metal layer such as Aluminum, or a metal layer on top of a dielectric layer with its thickness close to quarter-effective-wavelength of the incident light. Reflectors generally have unique and strict thickness tolerance (<5%) to ensure high optical yield, and in this implementation, a stopping (etch or polish stopping) layer 32 is provided in a photodiode/photodetector structure which will improve the thickness uniformity control of the reflector structure. Note that the process flow provided above is not stated in specific order and can be rearranged in any order. For example, another etching process to further remove the stopping layer 32 can be added before depositing the reflector such that the CMP process induced thickness variation on the stopping layer 32 can be further reduced. In some implementations, the stopping layer 32 is nitride and a wet etch process including phosphorus acid is used to remove the nitride before depositing the reflector 36. Moreover, in the above example, the second layer 140 forming a Ge epitaxial mesa region has lattice mismatch to the surface of the Si substrate 100, and the reflector 36 has a predetermined thickness such that a predetermined reflectivity can be achieved when an optical signal passing and being reflected by the reflector 36, at least part of the optical signal is absorbed by the second layer 140.

Figure 7A:
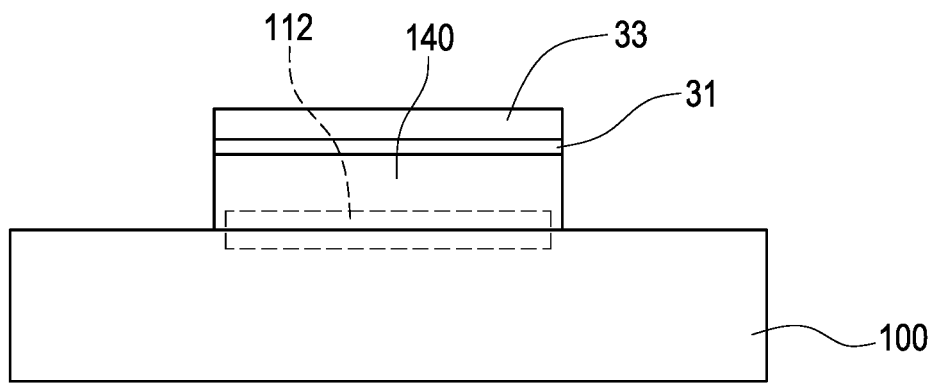
FIGS. 7A to 7E are the sectional views illustrating the manufacturing steps of forming a photodiode with etch/polish stopper according to still another implementation of the present disclosure.
Figure 7B:
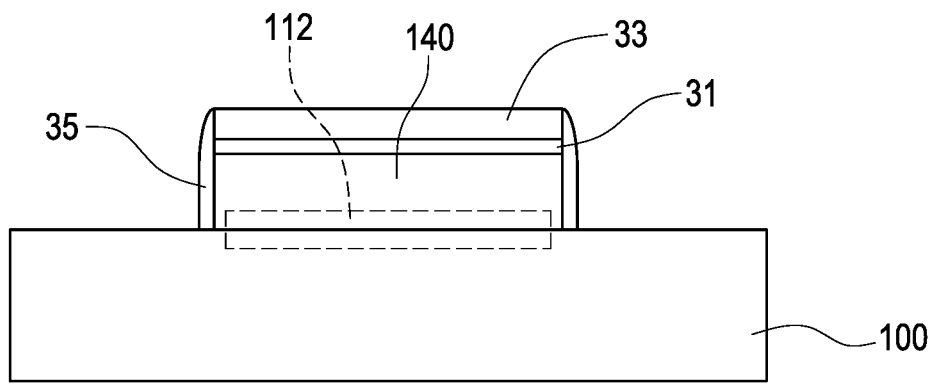
Figure 7C:
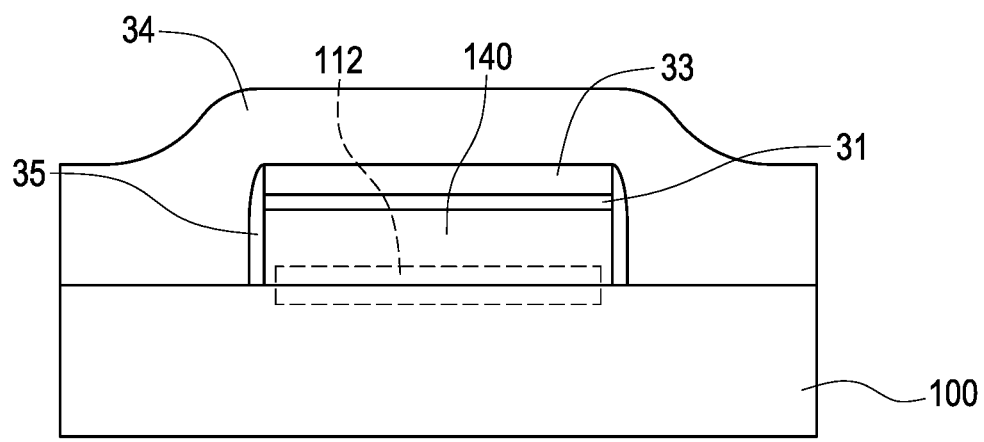
Figure 7D:
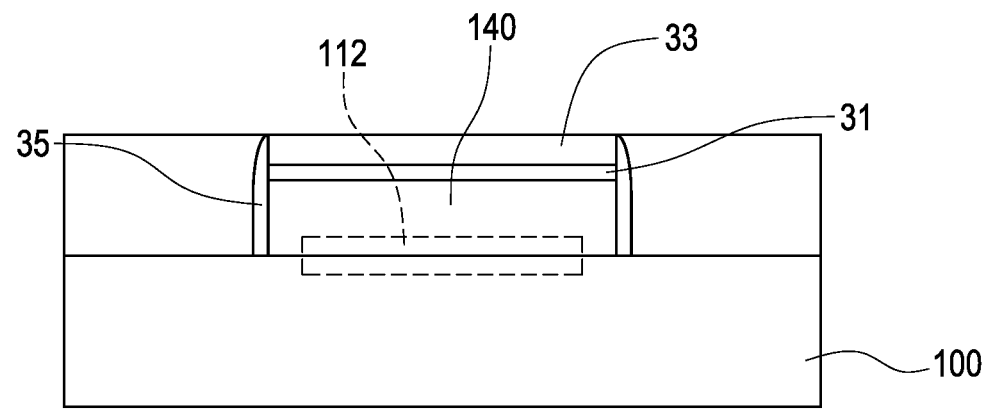
Figure 7E:
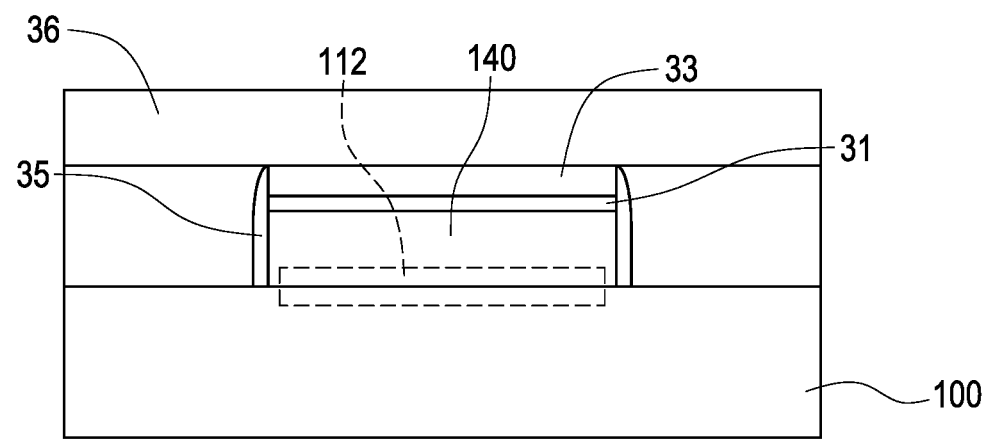

FIGS. 7A to 7E are the sectional views illustrating the manufacturing steps of forming a photodiode/photodetector with etch/polish stopper according to still another implementation of the present disclosure. As shown in FIG. 7A, the process can succeed the step S102 shown in FIG. 2B. The interfacial layer 112 can be used for counter doping as described with reference to FIGS. 2A to 3C, or for diffusion control as described with reference to FIGS. 4A to 4C, or be formed with larger dielectric index than that of the second layer 140 for bandwidth adjustment. A passivation layer 31 with material such as, but not limited to, Si (amorphous or poly-crystalline) or silicon oxide or nitride or their combinations is formed on the resulting structure. Afterward, a stopping layer 33 with material such as, but not limited to, nitride is formed atop the passivation layer. The thickness of the stopping layer 33 is typically from 10 A to 2000 A, with a thickness from 100 A to 500 A being more typical. The passivation layer 31, the stopping layer 33 and the underlying Ge epitaxial layer 140 are then patterned simultaneously to form a mesa structure shown in FIG. 7A. Then in FIG. 7B, a passivation spacer 35 is formed on the mesa (including the passivation layer 31, the stopping layer 33, and the Ge epitaxial mesa region 140) sidewall. In some implementations, the passivation spacer is formed by first conformally depositing a passivation film on the mesa to result in a relatively thicker region near the sidewall. Then a directional (anisotropic) etch is applied to remove the spacer material on the field, leaving only the sidewall region with relatively thicker layer remained as the spacer. Afterward, an interlayer dielectric (ILD) layer 34 is then deposited to cover up the whole mesa structure and can be optionally pre-planarized by either reflow or chemical mechanical polish (CMP) process as shown in FIG. 7C. As shown in FIG. 7D, the ILD layer 34 is processed by CMP process until the portion of the ILD layer 34 atop the stopping layer region 33 is substantially removed, whether a pre-planarized process is processed in FIG. 7C or not. If a pre-planarized process in FIG. 7C is not performed, then a single polish process can be used to form the structure in FIG. 7D. Afterward, as shown in FIG. 7E a reflector 36 is then uniformly deposited on top of the stopping layer region 33, similar to what is described in FIG. 6E.

Figure 8A:
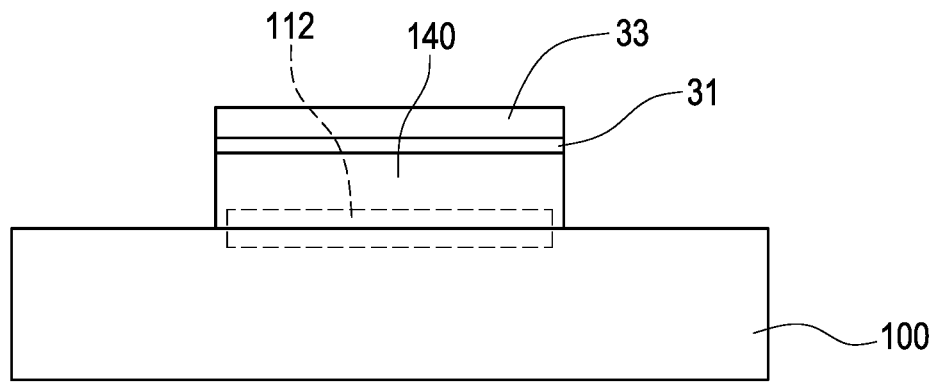
FIGS. 8A to 8F are the sectional views illustrating the manufacturing steps of forming a photodiode with etch/polish stopper according to still another implementation of the present disclosure.
Figure 8B:
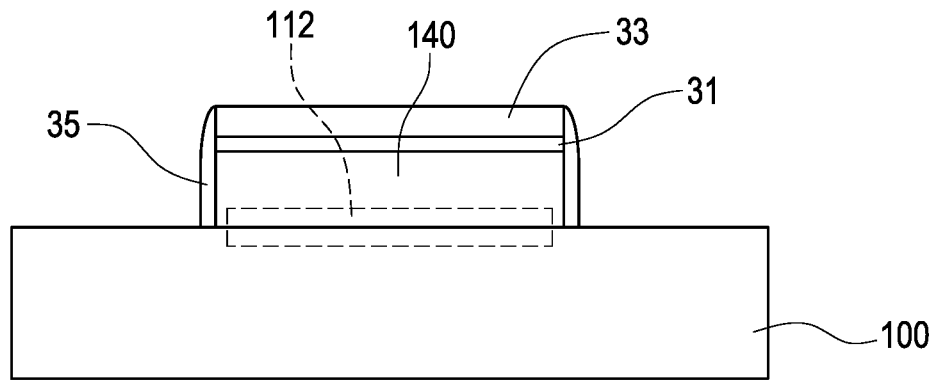
Figure 8C:
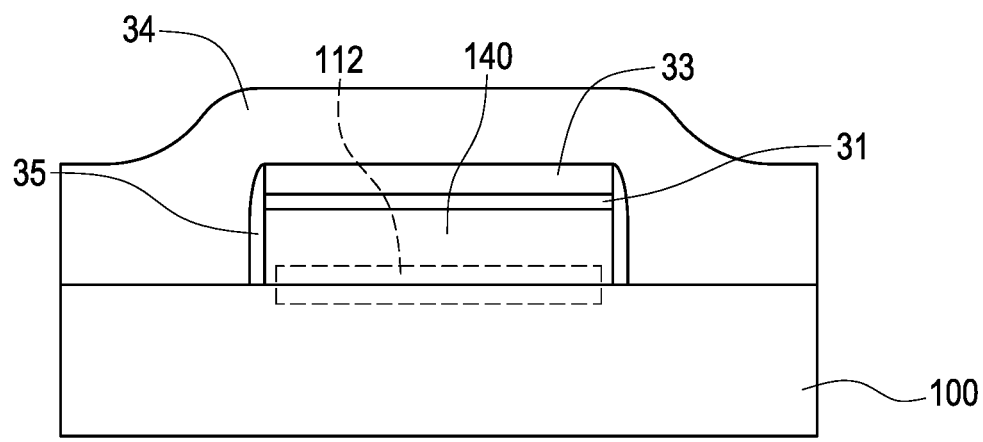
Figure 8D:
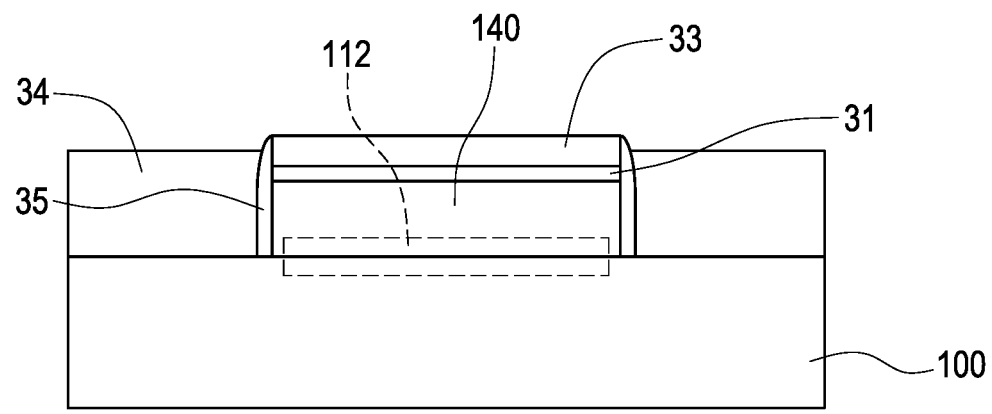
Figure 8E:
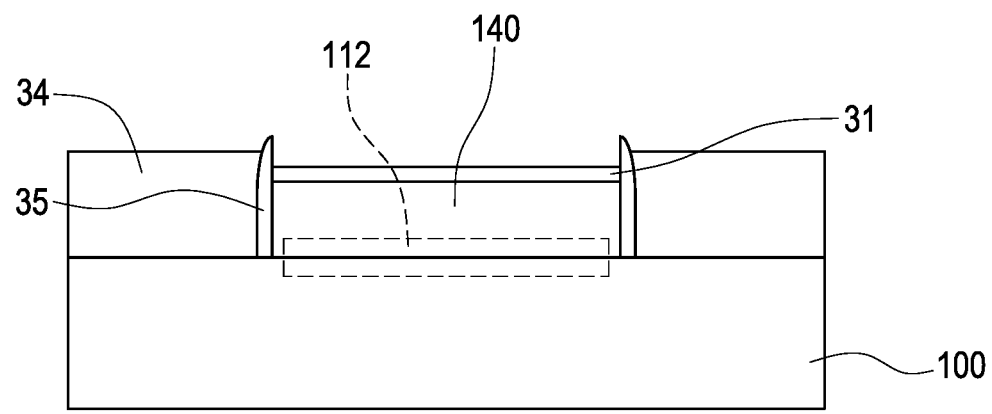
Figure 8F:
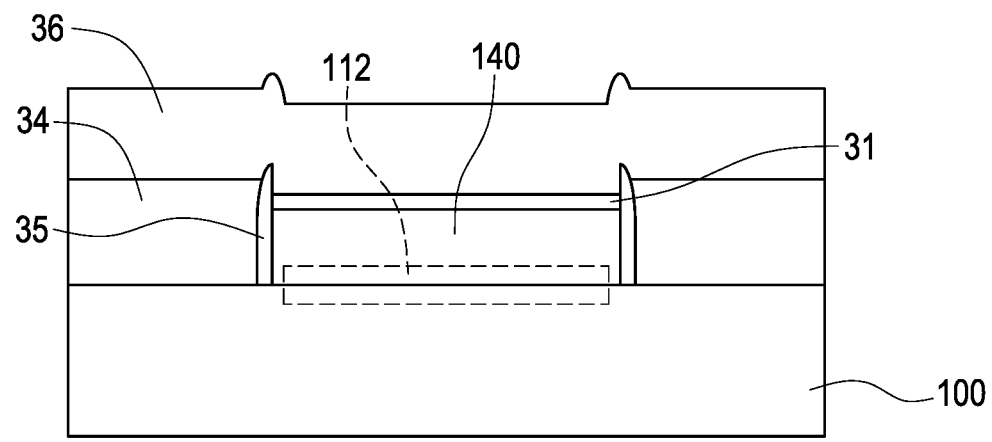

FIGS. 8A to 8F are the sectional views illustrating the manufacturing steps of forming a photodiode/photodetector with etch/polish stopper according to still another implementation of the present disclosure. The initial steps illustrated by FIG. 8A to 8C are similar to the description of FIG. 7A to 7C, and in FIG. 8D, the ILD layer 34 is further processed by CMP process or etch back process and the process stops near the stopping layer region 33 with some over-polishing or over-etching on either the ILD 34 or the stopping layer 33. Compared to FIG. 7, in this implementation, the stopping layer 33 can be referred to as dummy stopping layer because it is removed at a later process, and therefore, the removal process does not need to be selective to the stopping layer as described before, hence further improving the process flexibility. As shown in FIG. 8E, the dummy stopping layer 33 is then removed by wet chemical process or combination of wet and dry etching process. The selected chemical can react only with stopping layer 33 and be highly selective to the rest of the materials exposed such as the ILD 34. For example, if the stopping layer is nitride, a phosphoric acid based wet etch process can be used. Afterward, as shown in FIG. 8F a reflector 36 is then uniformly deposited on top of the resulting structure as described in FIGS. 6E and 7E. With this approach, the thickness uniformity of the top reflector 36 can be well controlled by film deposition step instead of a polish process, meaning better uniformity control than conventional planarization process.

Figure 9A:
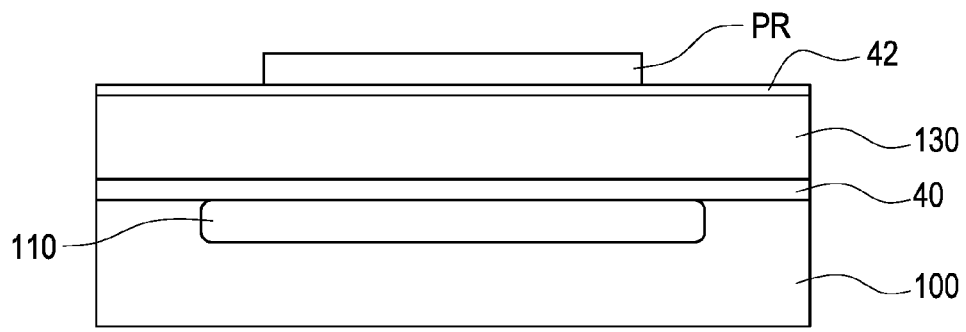
FIGS. 9A to 9D are the sectional views illustrating the manufacturing steps of forming a photodiode with conformal selective Ge etching process as isolation according to an implementation of the present disclosure.
Figure 9B:
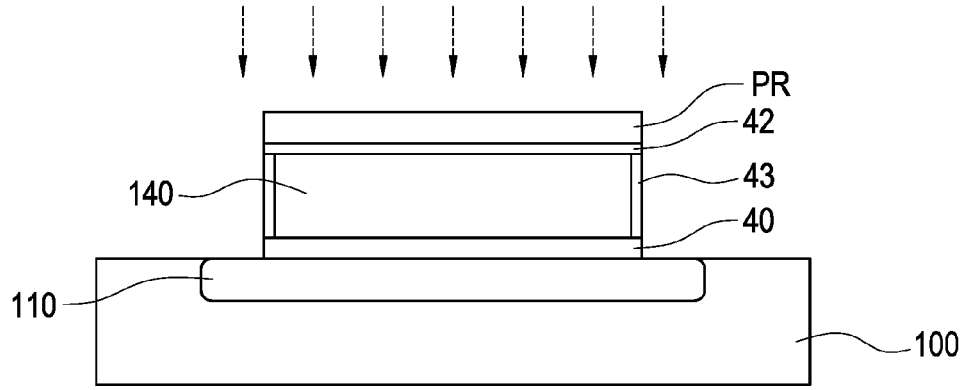
Figure 9C:
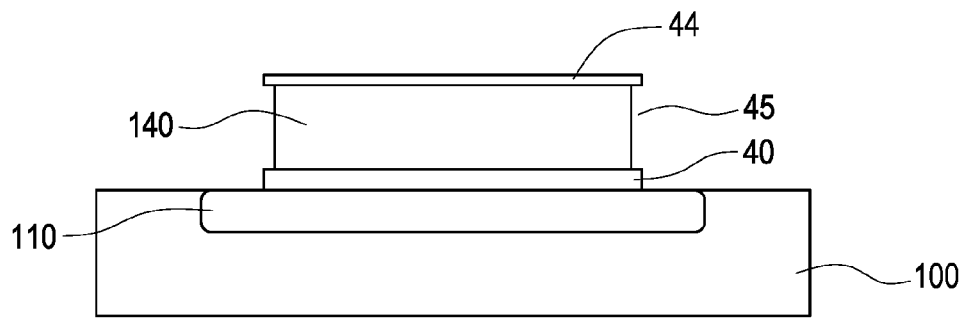
Figure 9D:
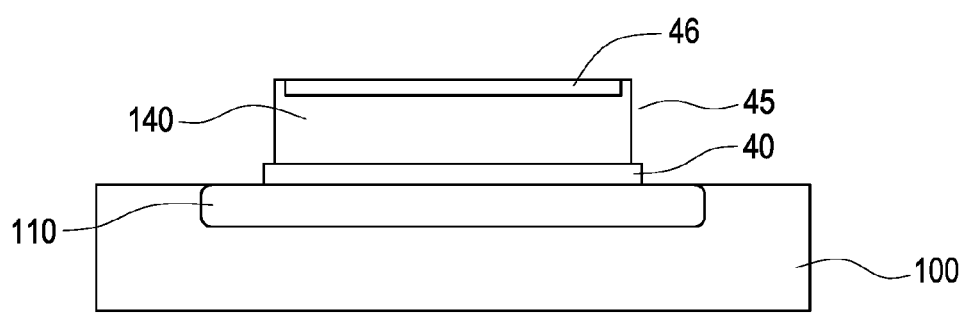

FIGS. 9A to 9D are the sectional views illustrating the manufacturing steps of forming a photodiode/photodetector with conformal selective Ge etch according to another implementation of the present disclosure. As shown in FIG. 9A, the process can succeed the step S102 shown in FIG. 2B with an interfacial layer 40 placed between the epitaxial layer 130 and the underlying Si substrate 100. In some implementations, the epitaxial layer 130 includes Ge, the interfacial layer 40 can be an intrinsic Si layer functioning as a counter doping layer, a dopant diffusion layer or both, and a passivation layer 42 made out of dielectric material is formed on the epitaxial layer 130. Afterward, as shown in FIG. 9B, the passivation layer 42, the underlying epitaxial layer 130 and the interfacial layer 40 are patterned fully or partially by RIE to form a mesa structure 140. With the involvement of directional ion etching (ex: RIE), it causes damage zone 43 for the epitaxial layer near the mesa sidewall as shown in FIG. 9B. As shown in FIG. 9C, selective Ge etch is performed to remove the damaged zone 43. This process will cause a lateral recess 45 as shown in FIG. 9C. Since the top surface of the epitaxial layer 130 is covered by dielectric passivation layer 42, the etching process is mostly active on mesa sidewall. The methods of performing this conformal selective Ge etch will be further discussed in the following description. Finally, as shown in FIG. 9D, in order to form a p-i-n or n-i-p structure, a thin layer 46 of the epitaxial layer near the top surface is converted into a highly-doped layer with its electrical polarity opposite to substrate doped region 110. Note that the process stated above is not limited to specific order.

With reference again to FIG. 9C, three possible methods to achieve conformal selective Ge etch can be further described. The 1st approach is using wet chemical etching to achieve conformal (isotropic) Ge etch with selectivity to Si. A typical Ge etch is normally performed in two steps. The 1st step is an oxidation reaction in which the etched material is converted into a higher oxidation state. The 2nd step leads to the dissolution of oxidation products. In one implementation, the wet etch chemistry includes but not limited to $NH_4OH$ (dissolution) and $H_2O_2$ (oxidant). Etch rate can be controlled by the level of $H_2O$ dilution. Moreover, this etch chemistry has etch selectivity on Si. Mixed NH4OH and H2O2 are used in Si industry for wafer cleaning and are known for very low Si etch rate. The 2nd approach is using a fluorine, chlorine, and bromine-based RIE process with downstream plasma configuration. It is observed that Ge is more reactive on the above chemistries without the assistance of ion bombardment. The downstream plasma configuration can provide a nearly damage free conformal etch without causing further sidewall damages from directional ion bombardment. By properly tuning the RIE conditions, an etch rate difference between Ge and Si of more than 40 to 1 can be achieved using this approach. For the 3rd approach, a high temperature gas phase HCl etch is performed under reduced or low pressure vacuum systems. HCl has gas chemistry that is capable of etching Si and Ge. Since this is a gas phase etching without assistance from any directional ion bombardment, the reaction is conformal. Moreover, the activation temperatures of etching Ge and Si are very different (more than 100 C), and hence when operating the etching process at near 600 C, only Ge will be etched at this temperature range, thus creating an etch selectivity between Si and Ge. Moreover, the above mentioned processes can be applied to the other photodiode implementations mentioned elsewhere in this disclosure, for example, the figures shown in FIGS. 6-8. For example, in FIGS. 7A and 8A, after mesa forming, the conformal selective Ge etch process can be introduced to remove part of the damaged sidewall of the second layer 140, leaving only the undamaged second layer within a selected area, and then forming a spacer layer 35 as mentioned before covering at least part of the exposed sidewall of the second layer 140.

Figure 9E:
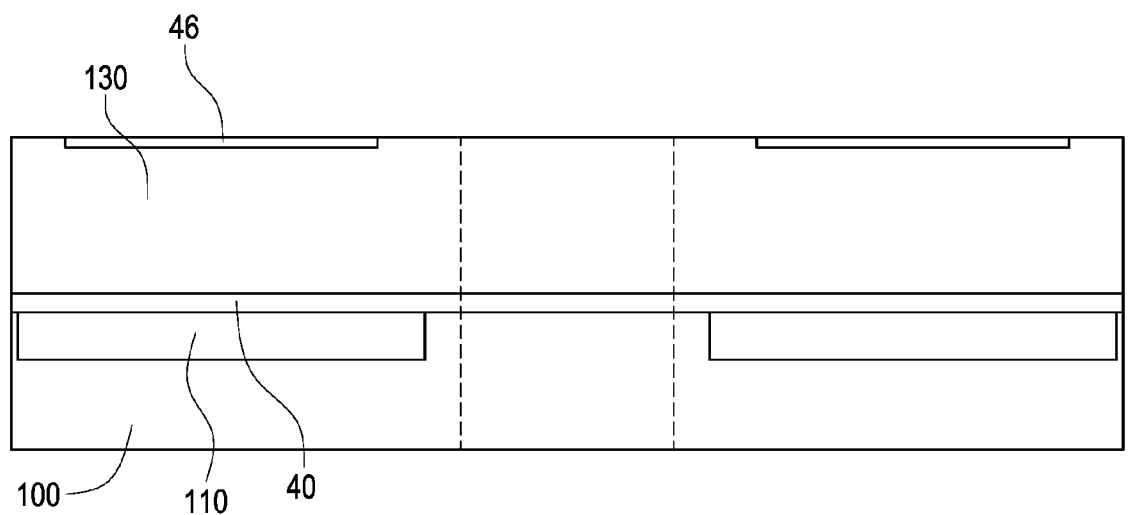
FIG. 9E is a sectional view showing photodiode with doping region instead of etching process as the isolation.

FIG. 9E is a sectional view showing photodiode with doping isolation. In this implementation, two absorption elements are defined by creating an opposite doping region between the two adjacent parts of the absorption elements, and each element has its own top doping region and its substrate doping region. For example, if the substrate doping is N-type for both elements, then the doping separation region is P-type. In some implementations, if the light absorption region is slightly P-type, then the doping separation region is N-type. In some implementations, if the absorption region includes Ge and the substrate is Si, their interfacial layer could be P-type due to the surface trap states near the SiGe interface, then the doping separation is N-type. The interfacial layer 40 here may be introduced intentionally as dopant diffusion control layer, or counter doping layer as described before; or it can indicate an inter-diffusion region between the upper Ge layer and Si substrate during the Ge epitaxial growth thermal process.

Figure 10A:
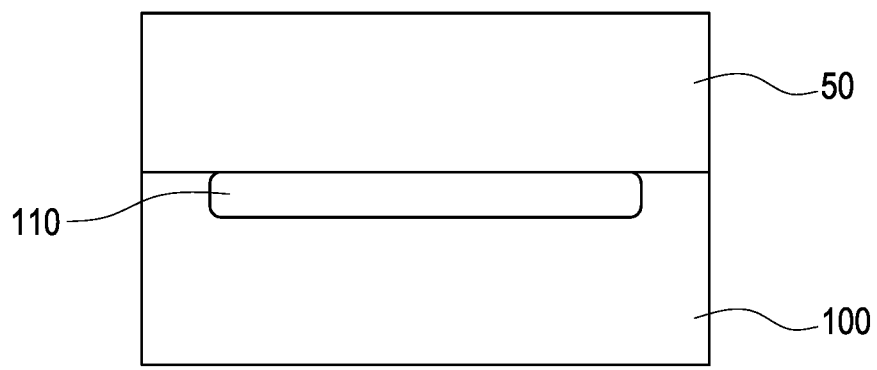
FIGS. 10A to 10L are the sectional views illustrating forming a photodiode with sidewall passivation, or/and interfacial layer, or/and multiple layer forming steps.
Figure 10B:
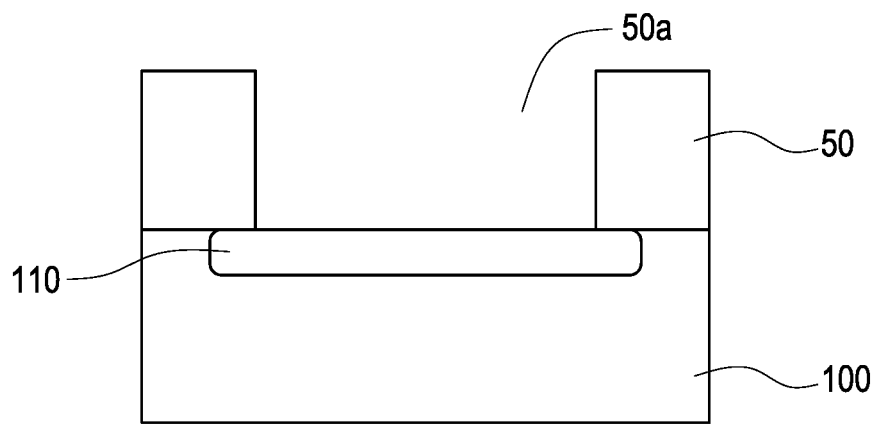
Figure 10C:
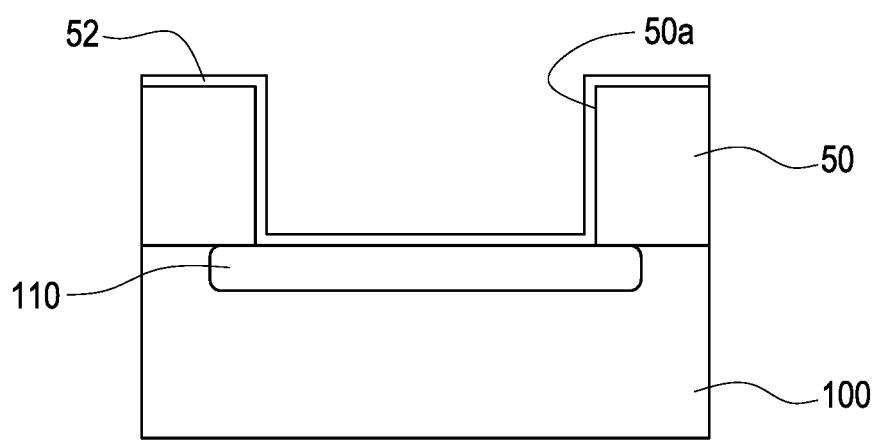
Figure 10D:
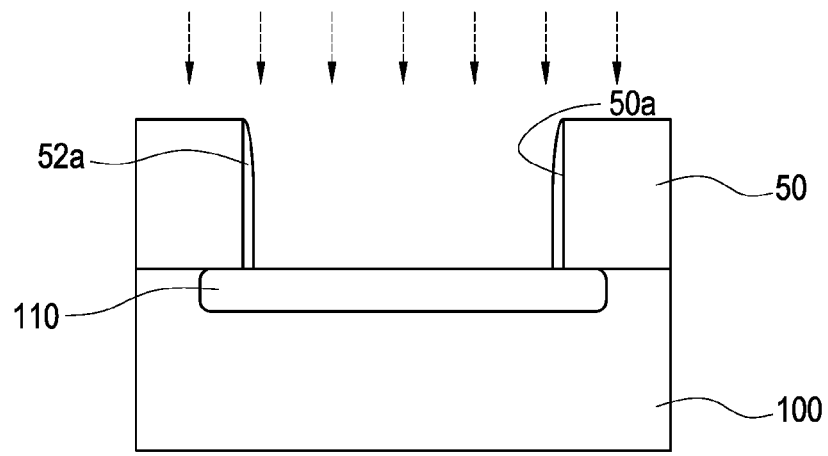
Figure 10E:
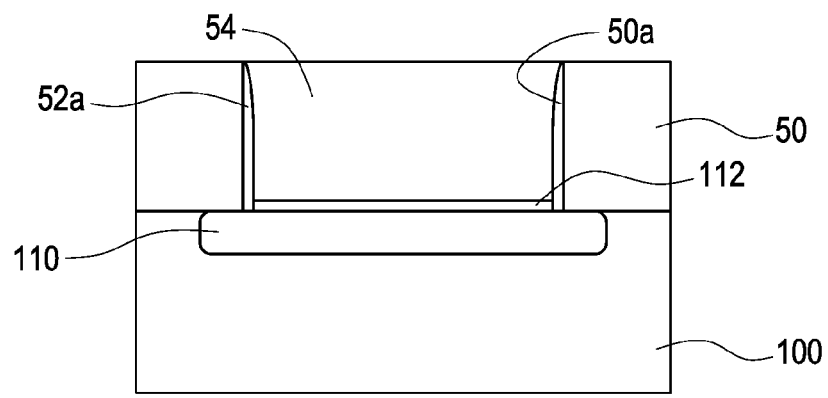
Figure 10F:
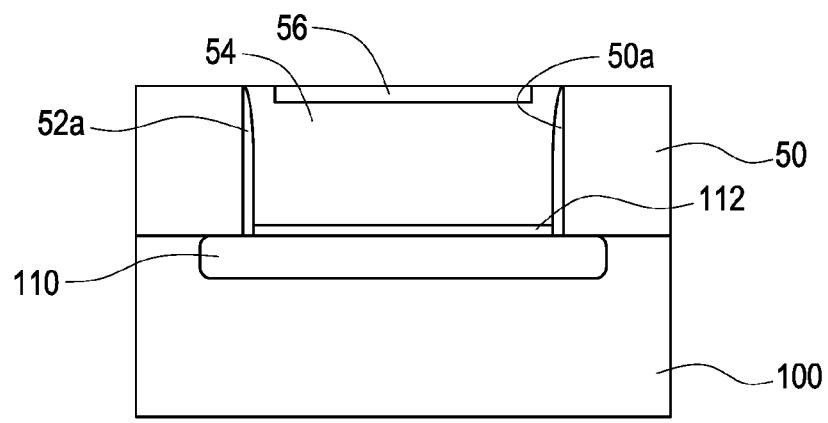

FIGS. 10A to 10F are the sectional views illustrating the manufacturing steps of forming a photodiode with sidewall passivation according to an implementation of the present disclosure. As shown in FIG. 10A, the process can succeed the step S100 shown in FIG. 2A, namely, a Si substrate 100 with doped layer 110. An isolation layer (such as a field dielectric layer) 50 is then deposited on the upper surface of the Si substrate 100. As shown FIG. 10B, a selective area opening 50a is defined in the field dielectric layer 50 by photolithography and etching, where the selective area opening 50a exposed a part (a first selected area) of the surface of the doped layer 110. Afterward, as shown in FIG. 10C, a passivation layer 52 is deposited on the upper face of the field dielectric layer 50 with the selective area opening 50a. In some implementations, the passivation layer 52 is Si (amorphous or poly-crystalline), nitride, or high-k dielectric. As shown in FIG. 10D, directional etch is performed to remove part of the passivation layer 52 and only passivation spacer 52a remains on the sidewall of the selective area opening 50a (namely the inner surface of the field dielectric layer 50). As shown in FIG. 10E, the first light absorption layer (such as photosensitive material layer including Ge) is selectively grown and fills the selective area opening 50a, and then it is planarized by CMP process to form a photo-sensitive region 54. Before selectively growing the first light absorption layer, an interfacial layer 112 may be optionally formed atop the first selected area. The interfacial layer 112 can be a counter doping layer as described with reference to FIGS. 2A to 3C, or dopant diffusion control layer as described with reference to FIGS. 4A to 4C, or a bandwidth adjustment layer with smaller dielectric index than that of the photo-sensitive region 54. Finally, as shown in FIG. 10F, a doped region 56 is formed within the photo-sensitive region 54 near the surface. In some implementations, the area of the doped region 56 can have different shape from the photo-sensitive region 54 when viewing from the top. For example, the shape of the photo-sensitive region 54 may be rectangular and the shape of the doped region 56 may be circular. In some implementations, the selective area opening 50a is rectangular and surrounded by (110) planes wherein when filled by a photo-sensitive region includes Ge can result in good surface passivation. In certain embodiments, other planes other than (110) can also be used to form the rectangular. To reduce the junction capacitance, the doped layer 56 is smaller than the rectangular opening 50b, and may be in a circular shape to substantially match the input optical beam profile. In some implementations, the area of the doped region 56 can have similar shape as the photo-sensitive region 54 when viewing from the top. For example, the shape of the photo-sensitive region 54 and the doped region 56 can both be rectangular or circular. In some implementations, the shape of the photo-sensitive region 54b and the doped layer 56 can both rectangular with rounded corners.

Figure 10G:
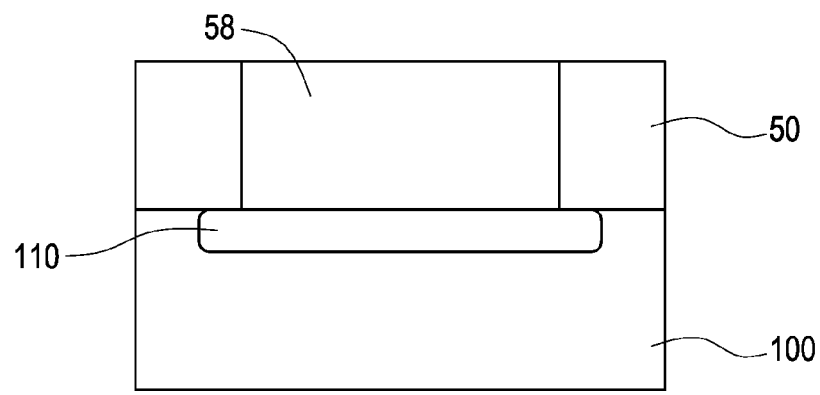
Figure 10H:
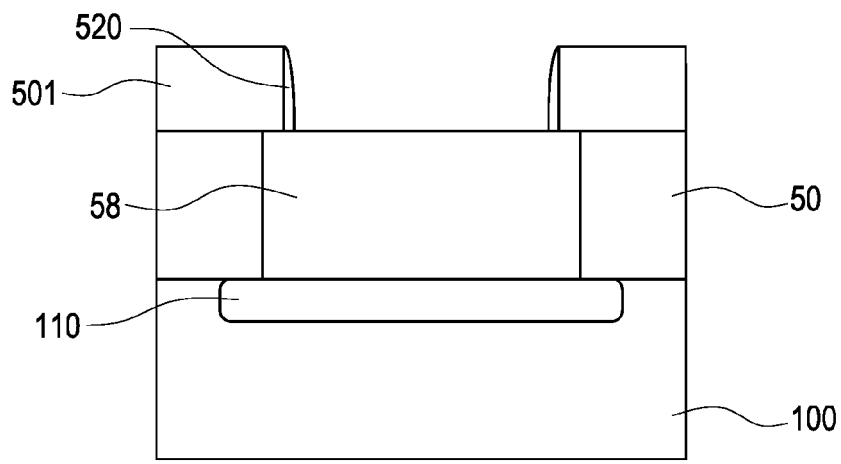
Figure 10I:
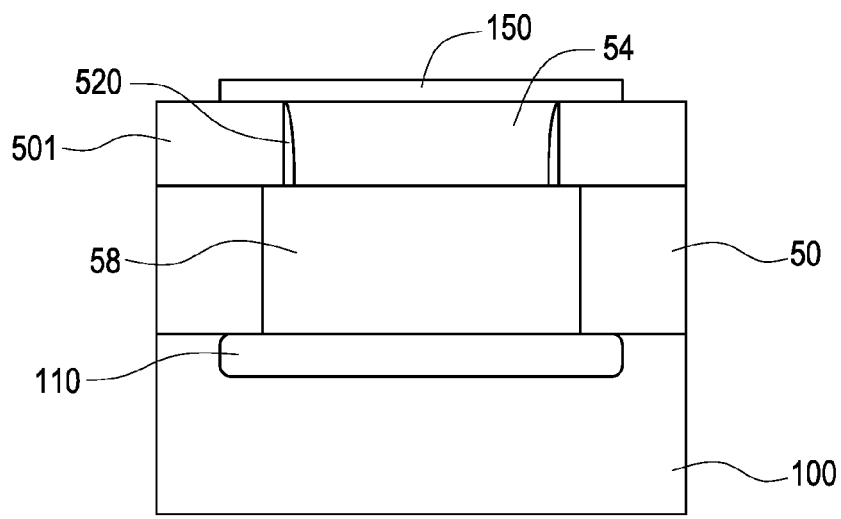

Alternatively, as shown in FIG. 10G, the process can be bifurcated from the step after FIG. 10B, a seeding layer 58 is first grown within the selective area opening 50a (seeding area). A CMP process may be performed after the growth of the seeding layer. Subsequently, a second isolation layer 501 is deposited on the resulting structure partially removed to expose a second selected area. As shown in FIG. 10H, a spacer 520 is formed on the sidewall corresponding to the second selected area. The exposed second selected area is then filled by the photo-sensitive region 54 and a passivation layer is deposited atop the photo-sensitive region 54, as shown in FIG. 10I. The steps described in FIGS. 10H and 10I are similar to the steps described in FIG. 10B to 10F except a seeding layer is first grown within a seeding area before performing the steps to form the spacer.

Figure 10J:
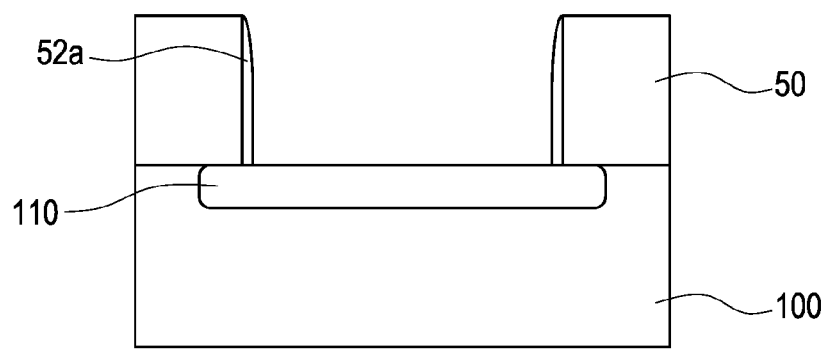
Figure 10K:
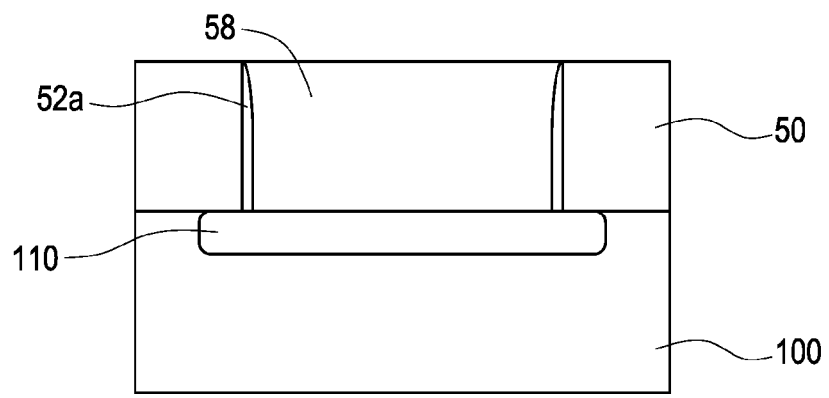
Figure 10L:
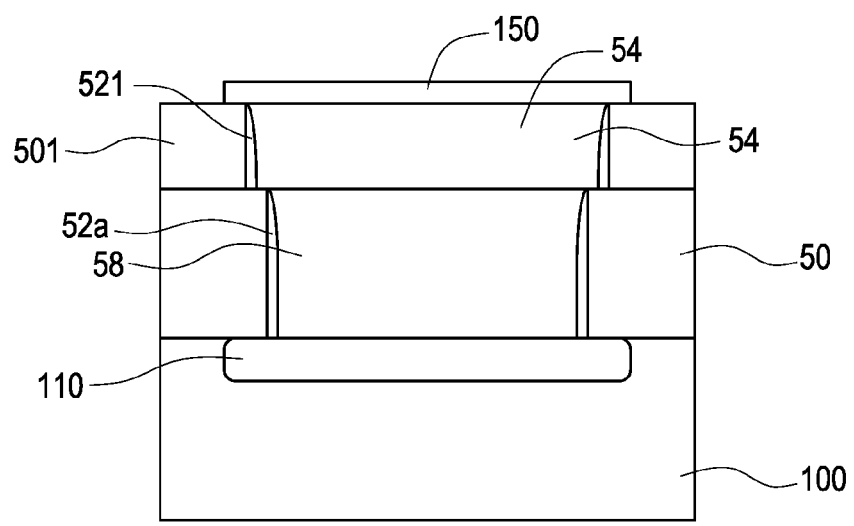

Alternatively, as shown in FIG. 10J, the process can be bifurcated from before step FIG. 10G. Prior to seeding layer filling of the selective area opening 50a (seeding area), a bottom spacer 52a can be formed on the sidewall. As shown in FIG. 10K, a seeding layer 58 is grown within the selective area opening 50a (seeding area) and a CMP process can be performed after the growth of the seeding layer. At this point, the steps described in FIG. 10H to 10I may be performed to form the upper layer of photo-sensitive region 54. Subsequently, processes similar to those described in FIGS. 2F to 2H or other variations can be applied to form the electrical contacts of the photodiode. In some implementations, the seeding layer may be Si, Ge, or SiGe with various Ge content. The photo-sensitive region may be Si, Ge or SiGe with various Ge content. In some implementations, the photo-sensitive region exhibits higher Ge content than the seeding layer. Furthermore, an interfacial layer may be inserted between the seeding layer and the substrate, or/and between the photo-sensitive region and the substrate, or/and between the seeding layer and the photo-sensitive region. In some implementations, the interfacial layer can function as a counter doping layer, or/and a dopant diffusion layer, or/and a bandwidth adjustment layer. In some implementations, the seeding layer is of Si material functioning as a dopant diffusion control layer to reduce the dopant diffusion from the substrate into the photo-sensitive region. In some implementations, the seeding layer has substantially the same material content as the photo-sensitive region such as Ge. In some implementations, the seeding layer may be grown separately from the photo-sensitive region above the seeding layer to reduce the thermal budget since other process steps such as forming silicide may be performed between the two growths. Such two-step growth method enables higher overall achievable thickness for the photo-sensitive region of substantially the same material compositions. In some implementations, an intentional or unintentional sidewall misalignment exists between the seeding area and the second selective area due the involvement of multiple lithography steps. Note that the drawings shown in FIG. 10 are for illustrative purpose and should not be viewed in a restrictive sense. For example, in FIGS. 10H and 10I, the spacer formation may also be optional in this two-step deposition/growth scenario, namely first forming a seeding region 58, then forming a second photo-sensitive region 54 without introducing the spacer 520. As another example, the thickness of the photo-sensitive region 54 may be thicker than the thickness of the seeding region 58, and the opening area for the photo-sensitive region 54 may be larger, equal, or smaller than the seeding region 58.

Figure 11A:
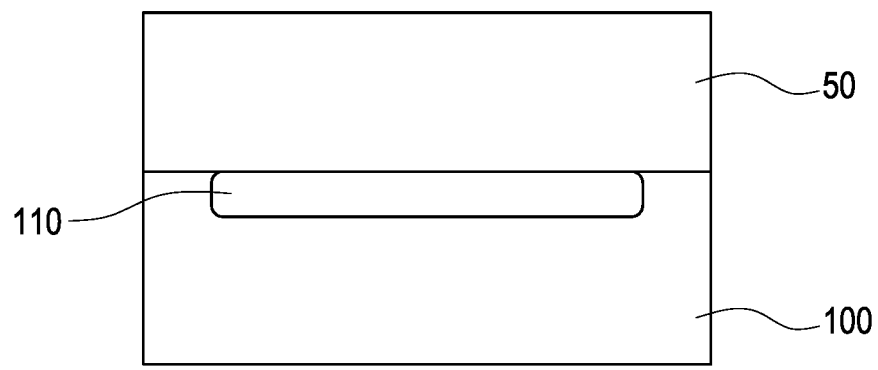
FIGS. 11A to 11K are the sectional views illustrating forming a photodiode with sidewall passivation, or/and interfacial layer.
Figure 11B:
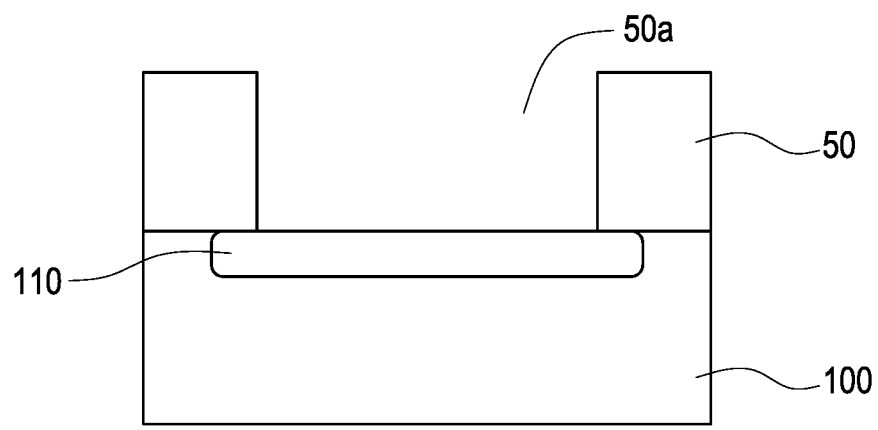

FIGS. 11A to 11G are the sectional views illustrating the manufacturing steps of forming a photodiode with sidewall passivation according to another implementation of the present disclosure. Similarly, the process can succeed the step S100 shown in FIG. 2A, namely, a Si substrate 100 with doped layer 110 and a field dielectric layer 50 deposited on the surface of the Si substrate 100, as shown in FIG. 11A. In FIG. 11B, a selective area opening 50a is defined in the field dielectric layer 50 by photolithography and etching, where the selective area opening 50a exposed a part of the surface of the Si substrate 100.

Figure 11C:
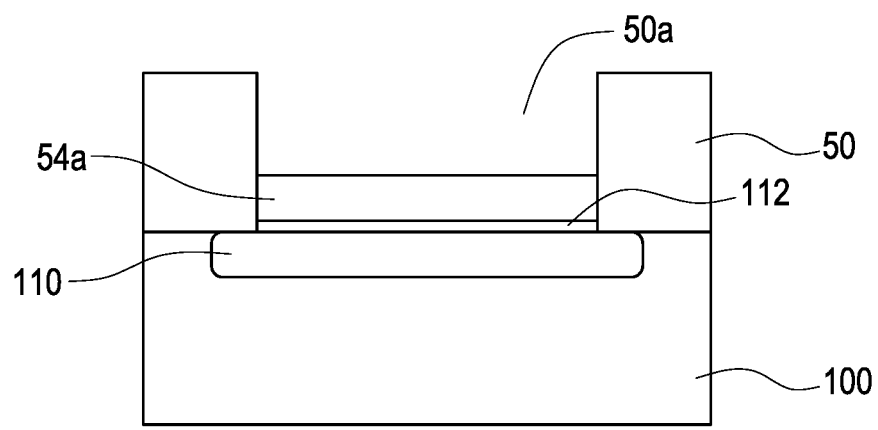

Subsequently, as shown in FIG. 11C, photosensitive materials such as Ge or SiGe of various Ge content is selectively grown to at least partially fill the selective area opening 50a to form a first photo-sensitive region 54a, which functions as a seed layer and will be described in more detail. In other implementations, prior to selectively growing the first photo-sensitive region 54a, an interfacial layer 112 may be formed as a counter doping layer as described with reference to FIGS. 2A to 3C, or as a diffusion control layer as described with reference to FIGS. 4A to 4C.

Figure 11D:
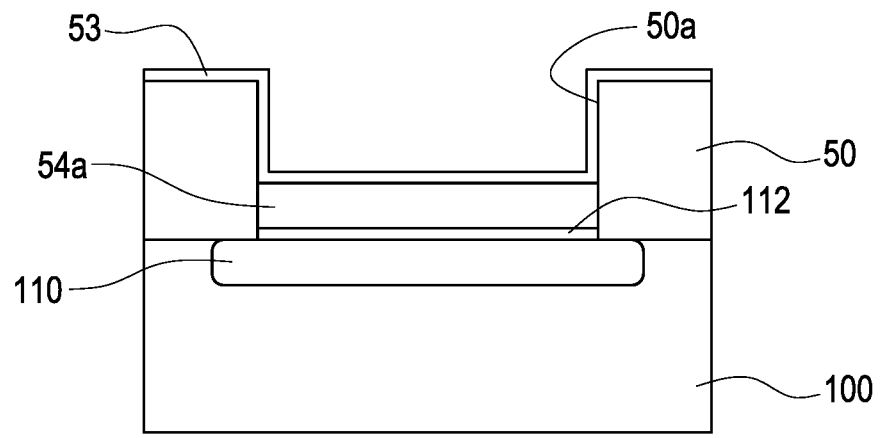
Figure 11E:
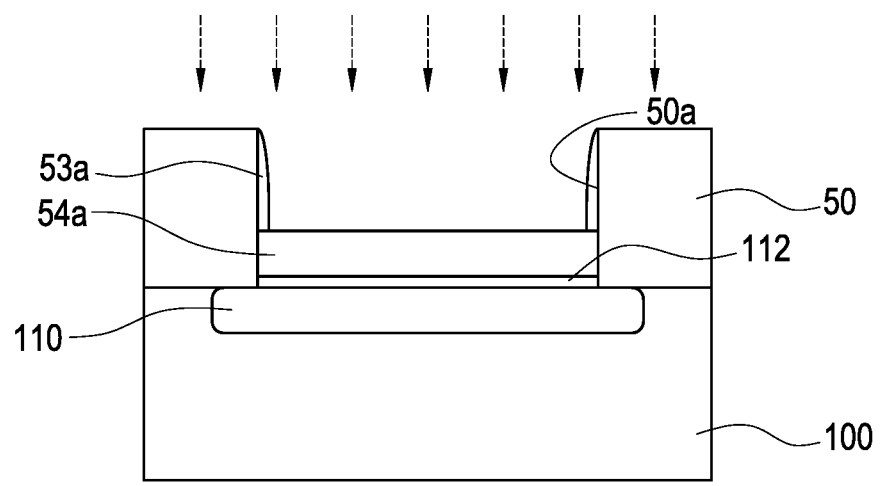
Figure 11F:
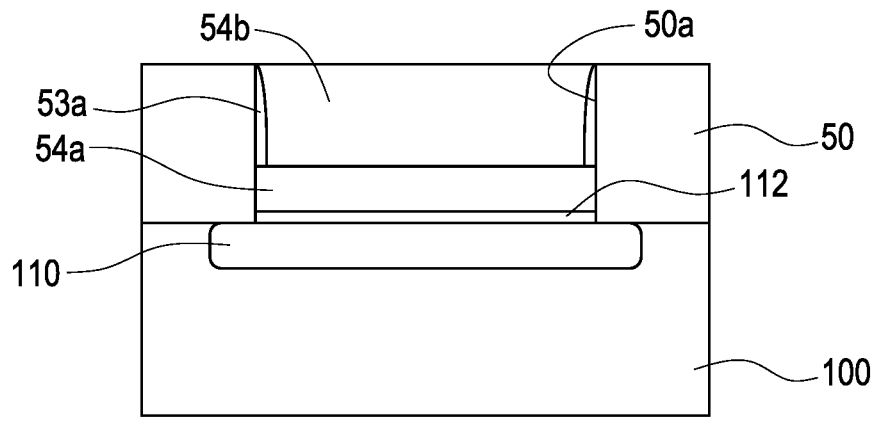
Figure 11G:
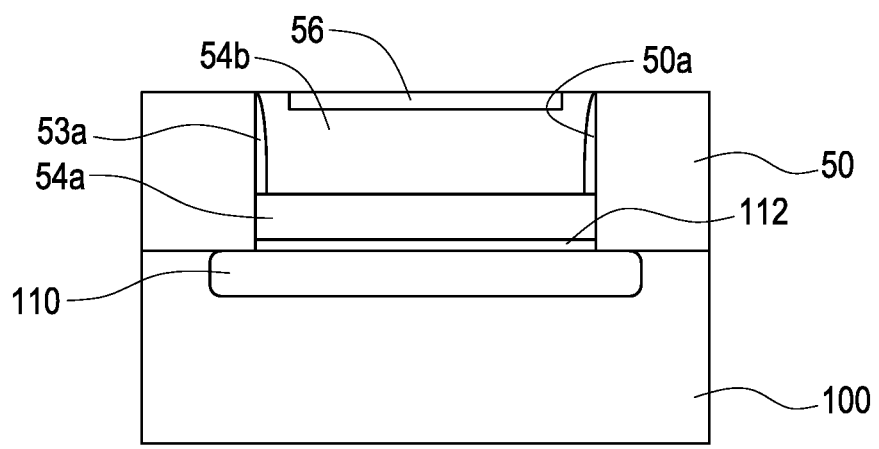

As shown in FIG. 11D, a passivation layer 53 is deposited on the upper surface of the field dielectric layer 50 and the upper surface of the first photo-sensitive region 54a. The material of the passivation layer 53 may include Si (amorphous or poly-crystalline), oxide, nitride, high-k dielectric or their combinations. As shown in FIG. 11E, directional etch is performed to remove part of the passivation layer 53 and only passivation spacer 53a remains on the sidewall of the selective area opening 50a. As shown in FIG. 11F, photo-sensitive material such as Ge is selectively grown to fill the remaining part of the selective area opening 50a to form a second photo-sensitive region 54b, and the second photo-sensitive region 54b is then planarized by CMP process. Finally, as shown in FIG. 11G, a doped layer 56 is formed within the second photo-sensitive region 54b and near the upper surface of the second photo-sensitive region 54b. In some implementations, the doping type of doped layer 56 is p-type, and the doping type of the doped region 110 is n-type. In some implementations, the doping type of doped layer 56 is n-type, and the doping type of the doped region 110 is p-type. In some implementations, the area of the doped layer 56 can have different shape from the photo-sensitive region 54b when viewing from the top. For example, the shape of the photo-sensitive region 54b may be rectangular and the shape of the doped layer 56 may be circular. In some implementations, the selective area opening 50a is rectangular and surrounded by (110) planes wherein when filled by a photo-sensitive region includes Ge can result in good surface passivation. In certain embodiments, other planes other than (110) can also be used to form the rectangular. To reduce the junction capacitance, the doped layer 56 is smaller than the rectangular opening 50b, and may be in a circular shape to substantially match the input optical beam profile. In some implementations, the area of the doped layer 56 can have similar shape as the photo-sensitive region 54b when viewing from the top. For example, the shape of the photo-sensitive region 54b and the doped layer 56 can both be rectangular or circular. In some implementations, the shape of the photo-sensitive region 54b and the doped layer 56 can both rectangular with rounded corners. Upon completion of process steps shown in FIG. 11G, subsequent processes similar to those shown in FIGS. 2F to 2H or other variations may be performed to form the electrical contacts of the photodiode.

Figure 11H:
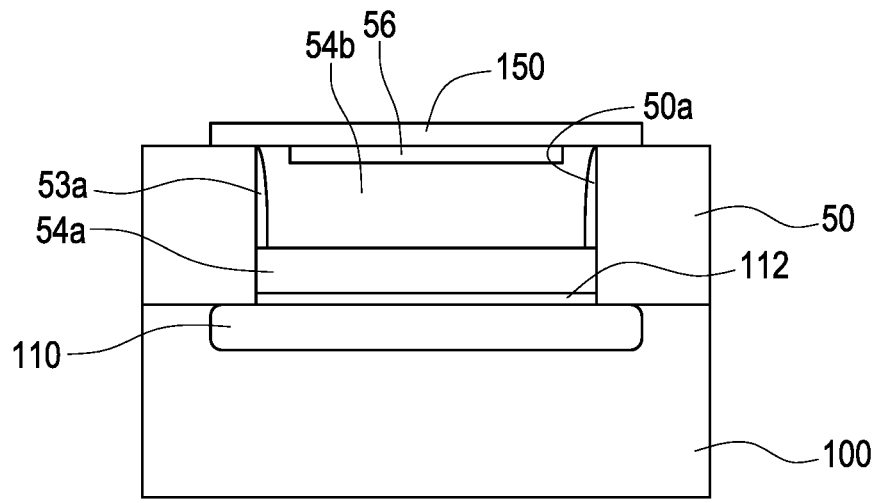
Figure 11I:
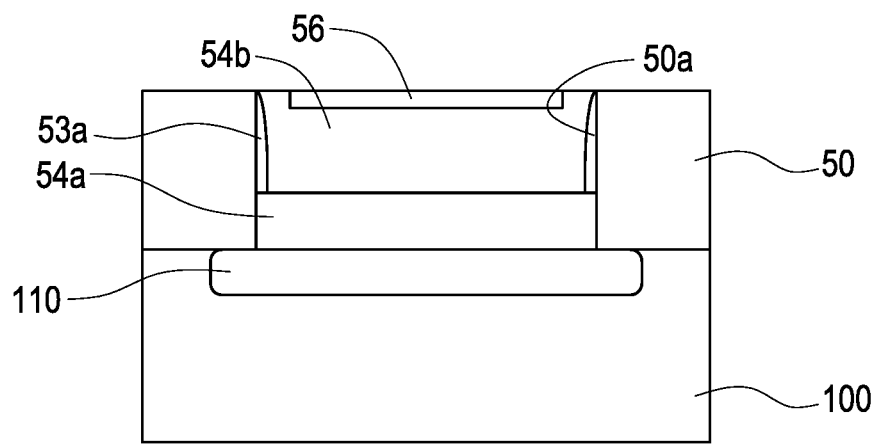
Figure 11J:
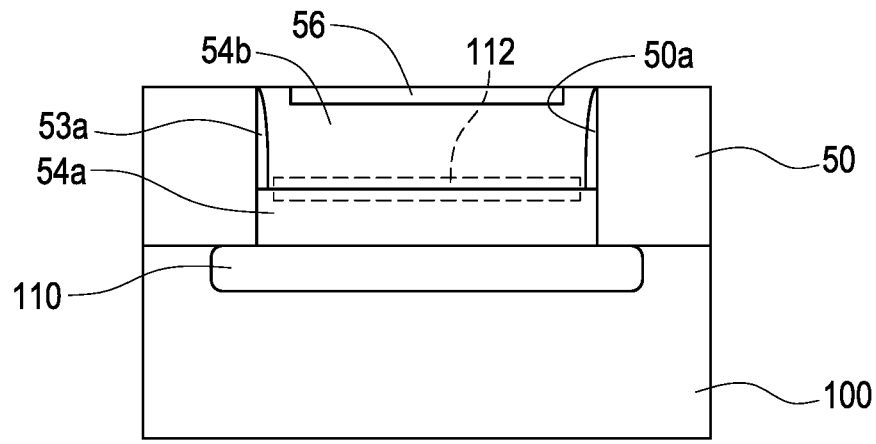
Figure 11K:
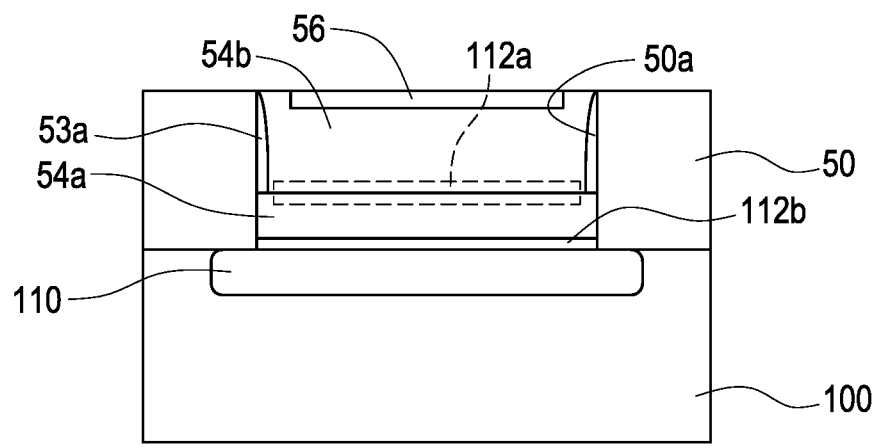

FIG. 11H is a section view showing the photodiode with sidewall passivation according to still another implementation of the present disclosure. The photodiode shown in FIG. 11H is similar to that shown in FIG. 11G except a passivation layer 150 is formed atop the doped layer 56 and the second photo-sensitive region 54b. FIG. 11I is a section view showing the photodiode with sidewall passivation according to still another implementation of the present disclosure. The photodiode shown in FIG. 11I is similar to that shown in FIG. 11G except that the interfacial layer 112 can be omitted in this implementation. FIG. 11J is a section view showing the photodiode with sidewall passivation according to still another implementation of the present disclosure. The photodiode shown in FIG. 11J is similar to that shown in FIG. 11G except that the interfacial layer 112 is placed between the first photo-sensitive region 54a and the second photo-sensitive region 54b. FIG. 11K is a section view showing the photodiode with sidewall passivation according to still another implementation of the present disclosure. The photodiode shown in FIG. 11K is similar to that shown in FIG. 11G except that two interfacial layers 112a and 112b are employed in this implementation. Namely, the first interfacial layers 112a is placed between the first photo-sensitive region 54a and the second photo-sensitive region 54b, and the second first interfacial layers 112b is placed between the doped layer 110 and the second photo-sensitive region 54b. Note that in FIG. 11, the illustration of a complete layer region and a dashed box region both indicates the existence of an interfacial layer 112. The aforementioned "surface of the Si substrate 100" is interchangeable with "surface of the doped layer 110" in certain implementations.

Figure 12A:
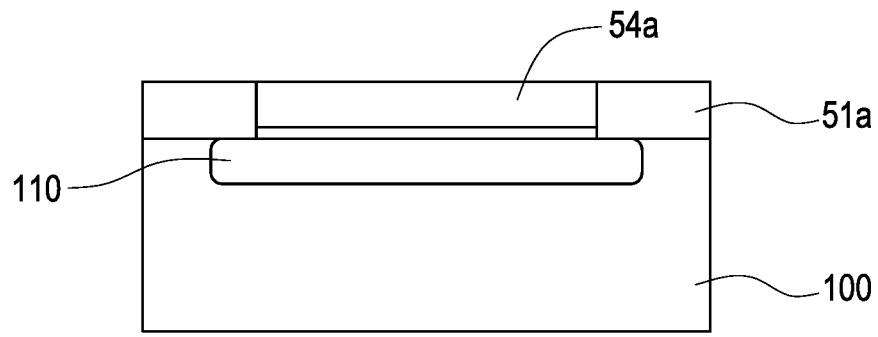
FIGS. 12A to 12K are the sectional views illustrating forming a photodiode with multiple layer forming steps, or/and sidewall passivation, or/and interfacial layer.
Figure 12B:
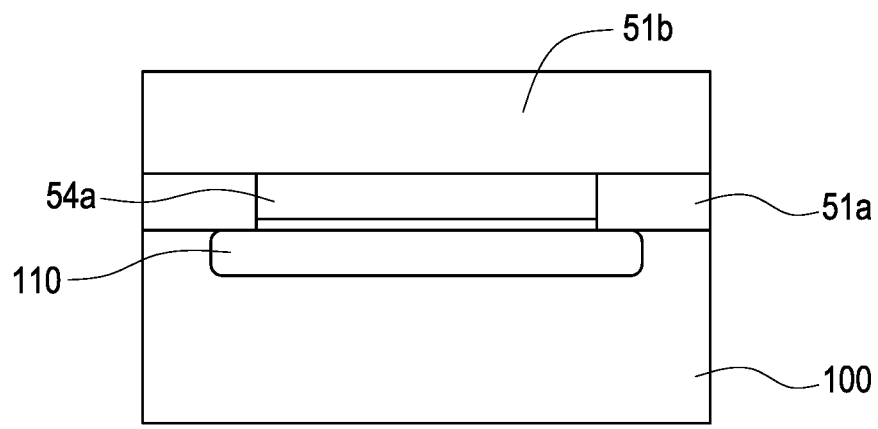
Figure 12C:
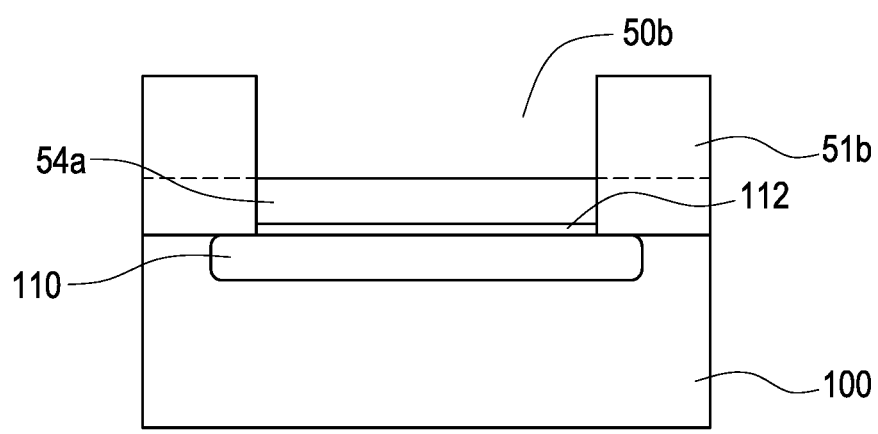

FIGS. 12A to 12G are the sectional views illustrating the manufacturing steps of forming a photodiode with sidewall passivation according to another implementation of the present disclosure. Similarly, the process can succeed the step S100 shown in FIG. 2A. In FIG. 12A, a Si substrate 100 with doped layer 110 and a field dielectric layer 51a deposited on the surface of the Si substrate 100. A selective area opening 50a is defined in the field dielectric layer 51a by photolithography and etching, where the selective area opening 50a exposed a part of the surface of the Si substrate 100. Subsequently, a seeding layer 54a is selectively grown to fill the selective area opening 50a. In some implementations, before selectively growing the first photo-sensitive region 54a, an interfacial layer 112 can be formed as a counter doping as described with reference to FIGS. 2A to 3C, or as a diffusion control as described with reference to FIGS. 4A to 4C. In some implementations, an optional CMP process can be performed after the growth of the seeding layer 54a. In FIG. 12B, a second isolation layer 51b is deposited, and part of the second isolation layer 51b is removed to expose a second selected area 50b as shown in FIG. 12C. Note that in certain actual process implementations, a sidewall misalignment may exist between the selective opening 50a and the second selected area 50b due to two separate lithography steps involved.

Figure 12D:
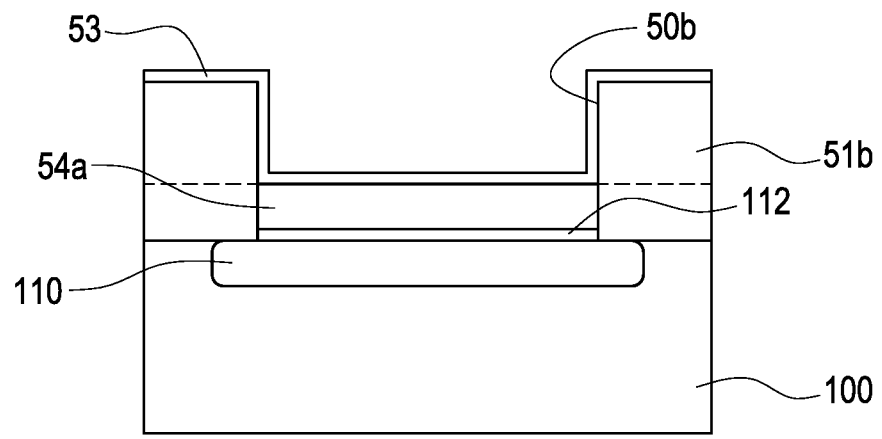
Figure 12E:
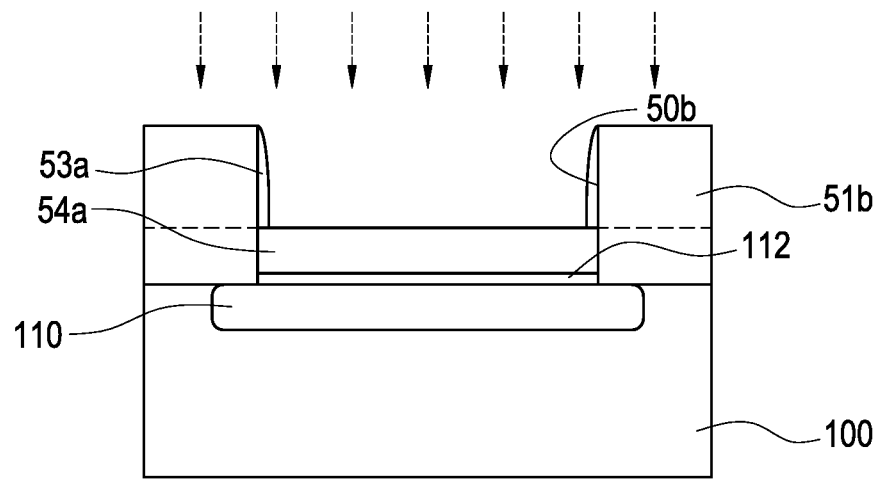

In FIG. 12D, a passivation layer 53 is deposited. In some implementations, the material of the passivation layer 53 can be Si (amorphous or poly-crystalline), oxide, nitride, high-k dielectric (ex: $Al_2O_3$, $HfO_2$) or their combinations. As shown in FIG. 12E, directional etch is performed to partially remove the passivation layer 53 and only passivation spacer 53a remains on the sidewall of the selective area opening 50b (namely the inner surface of the field dielectric layer 51b).

Figure 12F:
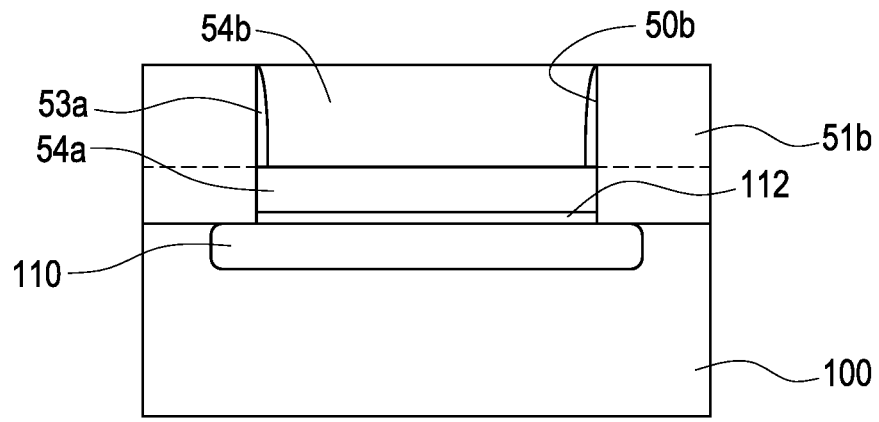
Figure 12G:
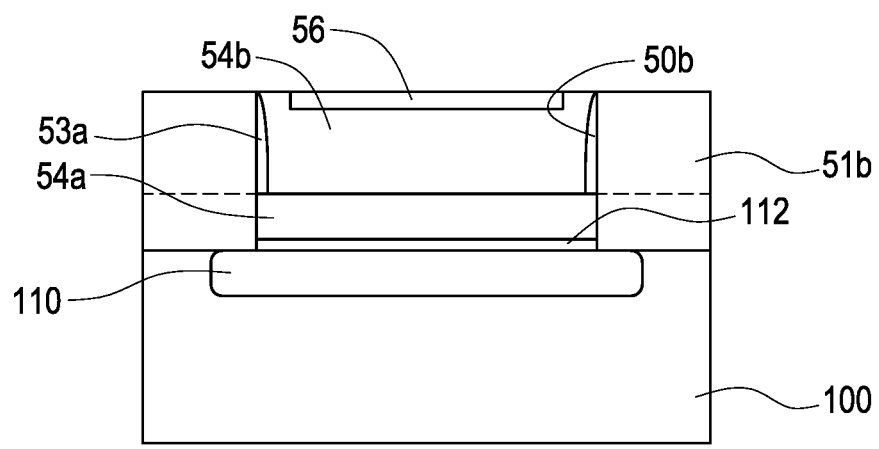

As shown in FIG. 12F, photosensitive material such as Ge is selectively grown to fill the remaining part of the selective area opening 50b to form a second photo-sensitive region 54b, and the second photo-sensitive region 54b is then planarized by CMP process. Finally, as shown in FIG. 12G, a doped layer 56 is formed within the second photo-sensitive region 54b and near the upper surface of the second photo-sensitive region 54b. In some implementations, the doping type of doped layer 56 is P-type, and the doping type of the doped region 110 is n-type. In some implementations, the doping type of doped layer 56 is n-type, and the doping type of the doped region 110 is p-type. In some implementations, the area of the doped layer 56 can have different shape from the photo-sensitive region 54b when viewing from the top. For example, the shape of the photo-sensitive region 54b may be rectangular and the shape of the doped layer 56 may be circular. In some implementations, the selective area opening 50b is rectangular and surrounded by (110) planes wherein when filled by a photo-sensitive region includes Ge can result in good surface passivation. In certain embodiments, other planes other than (110) can also be used to form the rectangular. To reduce the junction capacitance, the doped layer 56 is smaller than the rectangular opening 50b, and may be in a circular shape to substantially match the input optical beam profile. In some implementations, the area of the doped layer 56 may have similar shape as the photo-sensitive region 54 when viewing from the top. For example, the shape of the photo-sensitive region 54 and the doped layer 56 can both be rectangular or circular. For example, the shape of the photo-sensitive region 54 and the doped layer 56 can both be rectangular with rounded corners. Upon completion of process steps shown in FIG. 12G, subsequent processes similar to that shown in FIGS. 2F to 2H or other variations may be performed to form the electrical contacts of the photodiode.

Figure 12H:
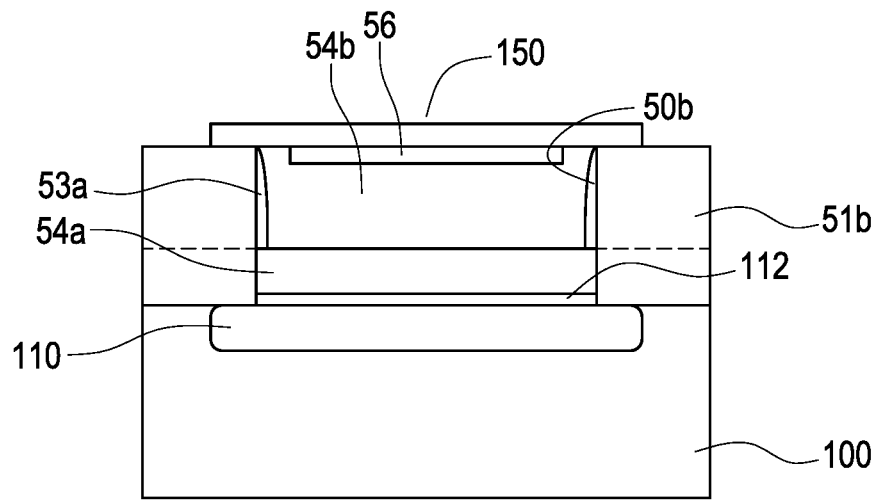
Figure 12I:
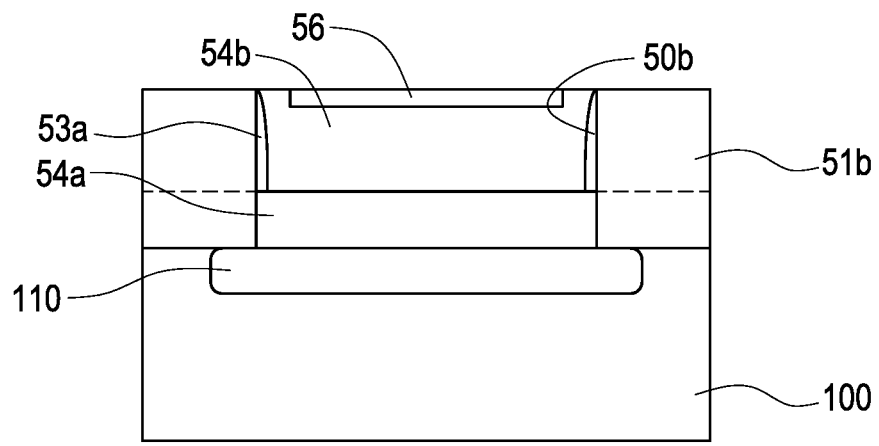
Figure 12J:
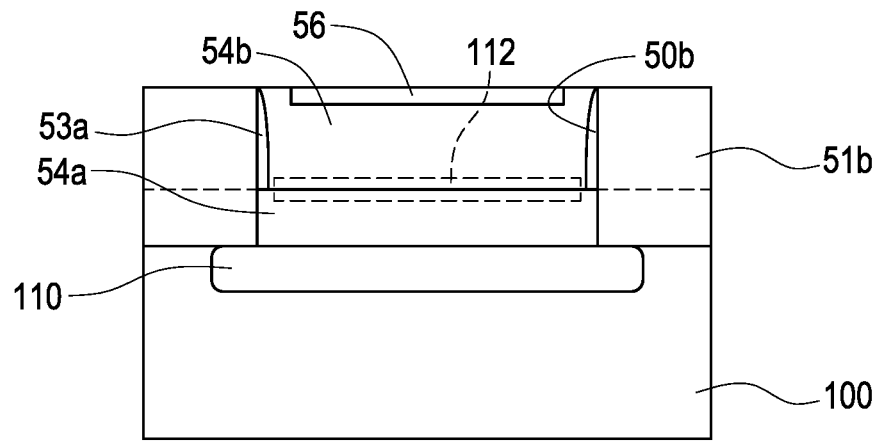
Figure 12K:
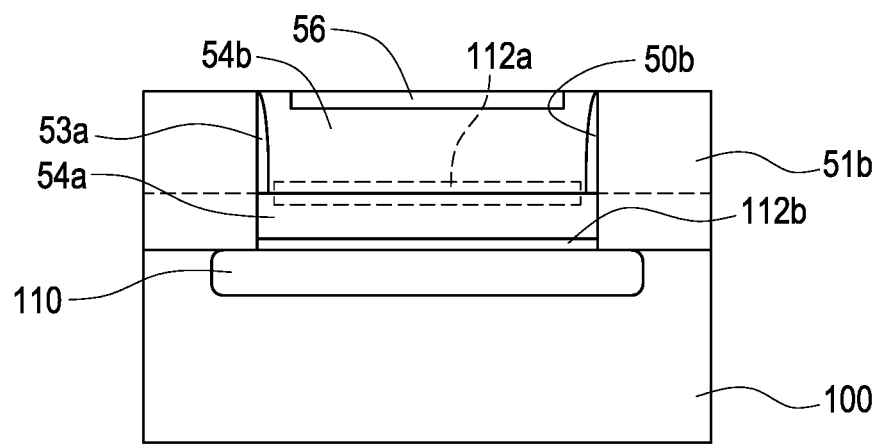

FIG. 12H is a section view showing the photodiode with sidewall passivation according to still another implementation of the present disclosure. The photodiode shown in FIG. 12H is similar to that shown in FIG. 12G except a passivation layer 150 is formed atop the doped layer 56 and the second photo-sensitive region 54b. FIG. 12I is a section view showing the photodiode with sidewall passivation according to still another implementation of the present disclosure. The photodiode shown in FIG. 12I is similar to that shown in FIG. 12G except that the interfacial layer 112 can be omitted in this implementation. FIG. 12J is a section view showing the photodiode with sidewall passivation according to still another implementation of the present disclosure. The photodiode shown in FIG. 12J is similar to that shown in FIG. 12G except that the interfacial layer 112 is placed between the first photo-sensitive region 54a and the second photo-sensitive region 54b. FIG. 12K is a section view showing the photodiode with sidewall passivation according to still another implementation of the present disclosure. The photodiode shown in FIG. 12K is similar to that shown in FIG. 12G except that two interfacial layers 112a and 112b are employed in this implementation. Namely, the first interfacial layers 112a is placed between the first photo-sensitive region 54a and the second photo-sensitive region 54b, and the second interfacial layers 112b is placed between the doped layer 110 and the second photo-sensitive region 54b. Note that in FIG. 12, the illustration of a complete layer region and a dashed box region both indicates the existence of an interfacial layer 112. Also note that the drawings shown in FIG. 12 are for illustrative purpose and should not be viewed in a restrictive sense. For example, in FIGS. 12D to 12K, the spacer formation may also be optional in this two-step deposition/growth scenario, namely first forming a seeding region 54a, then forming a second photo-sensitive region 54b without introducing the spacer 53a. As another example, the thickness of the photo-sensitive region 54b can be thicker or thinner than the thickness of the seeding region 54a, and the opening area for the photo-sensitive region 54b can be larger, equal, or smaller than the seeding region 54a. The aforementioned "surface of the Si substrate 100" is interchangeable with "surface of the N doped layer 110" in certain embodiments.

Figure 13:
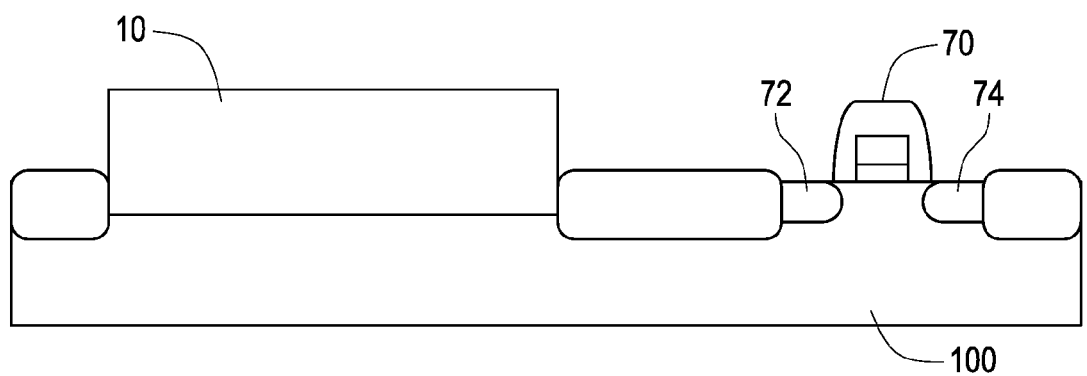
FIG. 13 is a sectional view showing one photodiode of the present disclosure integrated with a transistor.

FIG. 13 is a sectional view showing the photodiode of the present disclosure integrated with a transistor. A high doping region is provided at the substrate 100 for the source 72 and drain 74 region of a transistor 70. The isolation between the photodiode and the transistor can be done by shallow trench isolation, P-N junction isolation, thermal oxide or other forms of isolation.

Although the present invention has been described with reference to specific exemplary embodiments, it will be recognized that any and all of the implementations described above can be combined with each other, and the invention is not limited to the implementations described, but can be practiced with modification and alteration within the spirit and scope of this invention. Accordingly, the specification and drawings are to be regarded in an illustrative sense rather than a restrictive sense.

In some implementations, the materials of the interfacial layer, the seeding layer and the photo-sensitive region can be Si, Ge or SiGe with various Ge content. In some implementations, the photo-sensitive region has higher Ge content than the seeding layer. Furthermore, an interfacial layer can be inserted between the seeding layer and the substrate, or/and between the photo-sensitive region and the substrate, or/and between the seeding layer and the photo-sensitive region. In some implementations, the interfacial layer can function as a counter doping layer, or/and a dopant diffusion layer, or/and a bandwidth adjustment layer. In some implementations, the seeding layer includes Si and functions as dopant diffusion control layer to reduce the dopant diffusion from the substrate into the photo-sensitive region.

In some implementations, the seeding layer has substantially the same material content as the photo-sensitive region such as Ge. In certain embodiments, the seeding layer may be grown separately from the photo-sensitive region above the seeding layer to reduce the thermal budget since other process steps such as forming silicide may be performed between the two growths. Such two-step growth method enables higher overall achievable thickness for the photo-sensitive region of substantially the same material compositions. In some implementations, an intentional or unintentional sidewall misalignment exists between the seeding area and the second selective area due to the multiple lithography steps involved. In some implementations where selective growth is performed, a sloped shape can be formed during the growth step, and later be polished by CMP step as mentioned in this disclosure. For example, a (311) plane can be formed if Ge is selectively epitaxially grown on a surface. In some implementations, a recessed structure can be included before forming the substrate doping and the interfacial layer. In some implementations, a spacer can also be formed to cover the sidewall of the recess area according to the spacer formation process described before. Also note that certain actual implementation induced imperfections should also be covered in this disclosure as long as its concept follows this disclosure. Any variations, derivations from the description above should also be viewed as included in this invention.

While this specification contains many details, these should not be construed as limitations, but rather as descriptions of features specific to particular embodiments. Certain features that are described in this specification in the context of separate embodiments or implementations may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Thus, particular embodiments have been described. Other embodiments are within the scope of the following claims. For example, the actions recited in the claims may be performed in a different order and still achieve desirable results.

What is claimed is:

1. A method of forming a light absorption apparatus, the method comprising:
    doping a surface of a substrate to form a doped layer in the substrate; and
    forming, atop the doped layer, a photosensitive structure that includes (1) a counter doping layer at or near the bottom of the photosensitive structure; and
    (2) a dopant control layer atop the counter doping layer, wherein the dopant control layer has a material that retards dopant diffusion from the counter doping layer into an intrinsic layer in the photosensitive structure, wherein a material for the counter doping layer is one or more of:
    highly-doped Ge, or highly-doped SiGe with a Ge content no less than the dopant control layer,
    wherein the substrate is silicon based, and wherein both the counter doping layer and the intrinsic layer is germanium based.

2. The method of claim 1, wherein the dopant control layer is located in between the counter doping layer and the intrinsic layer.

3. The method of claim 1, wherein said material that retards dopant diffusion is one or more of: silicon (Si), silicon germanium (SiGe) with a germanium (Ge) content less than the intrinsic layer, carbon-doped SiGe, or carbon-doped Ge.

4. The method of claim 1, wherein a heterogeneous interface between the substrate and the photosensitive structure has a lattice mismatch more than 0.2%.

5. The method of claim 1, further comprising:
    forming another dopant control layer atop the intrinsic layer.

6. The method of claim 1, wherein the counter doping layer includes dopants to compensate for a built-in electrical potential at a heterogeneous interface between the photosensitive structure and the substrate.

7. The method of claim 6, wherein the dopants in the counter doping layer are configured to provide similar free carrier concentration to built-in carriers in a photosensitive material in the counter doping layer but with opposite electrical polarity.

8. The method of claim 1, further comprising:
    forming a stopping layer above the photosensitive structure;
    forming a dielectric layer atop the stopping layer;
    planarizing a wafer carrying the light absorption apparatus by removing the dielectric layer, wherein the planarizing step is to stop at the stopping layer; and
    forming a reflector layer above the photosensitive structure.

9. The method of claim 1, the method further comprising:
    after mesa patterning for the photosensitive structure, performing a selective etching process to remove at least a portion of the intrinsic layer damaged by reactive ion etching performed during the forming of the photosensitive structure.

10. The method of claim 9, wherein the selective etching process is with a selectivity of at least 1:5, the selectivity being a ratio of polish rate of silicon to germanium.

11. A light absorption apparatus comprising:
    a substrate having a doped layer; and
    a photosensitive structure atop the doped layer, the photosensitive structure including (1) a counter doping layer at or near the bottom of the photosensitive structure; and
    (2) a dopant control layer atop the counter doping layer, wherein the dopant control layer has a material that retards dopant diffusion from the counter doping layer into an intrinsic layer in the photosensitive structure, wherein a material for the counter doping layer is one or more of:
    highly-doped Ge, or highly-doped SiGe with a Ge content no less than the dopant control layer,
    wherein the substrate is silicon based, and wherein both the counter doping layer and the intrinsic layer is germanium based.

12. The apparatus of claim 11, wherein the dopant control layer is located in between the counter doping layer and the intrinsic layer.

13. The apparatus of claim 11, wherein said material that retards dopant diffusion is one or more of: silicon (Si), silicon germanium (SiGe) with a germanium (Ge) content less than the intrinsic layer, carbon-doped SiGe, or carbon-doped Ge.

14. The apparatus of claim 11, wherein a heterogeneous interface between the substrate and the photosensitive structure has a lattice mismatch more than 0.2%.

15. The apparatus of claim 11, further comprising:
    another dopant control layer atop the intrinsic layer.

16. The apparatus of claim 11, wherein the counter doping layer includes dopants to compensate for a built-in electrical potential at a heterogeneous interface between the photosensitive structure and the substrate.

17. The apparatus of claim 16, wherein the dopants in the counter doping layer are configured to provide similar free carrier concentration to built-in carriers in a photosensitive material in the counter doping layer but with opposite electrical polarity.

18. The apparatus of claim 11, further comprising:
    a stopping layer above the photosensitive structure.

* * * * *